(12) United States Patent
Rozin

(10) Patent No.: US 11,380,681 B2
(45) Date of Patent: Jul. 5, 2022

(54) INTEGRATED RECTIFIER

(71) Applicant: JERUSALEM COLLEGE OF TECHNOLOGY, Jerusalem (IL)

(72) Inventor: Alexander Rozin, Jerusalem (IL)

(73) Assignee: JERUSALEM COLLEGE OF TECHNOLOGY, Jerusalem (IL)

( * ) Notice: Subject to any disclaimer, the term of this patent is extended or adjusted under 35 U.S.C. 154(b) by 0 days.

(21) Appl. No.: 16/490,678

(22) PCT Filed: Mar. 6, 2018

(86) PCT No.: PCT/IL2018/050253
§ 371 (c)(1),
(2) Date: Sep. 3, 2019

(87) PCT Pub. No.: WO2018/163167
PCT Pub. Date: Sep. 13, 2018

(65) Prior Publication Data
US 2020/0020683 A1    Jan. 16, 2020

Related U.S. Application Data

(60) Provisional application No. 62/467,361, filed on Mar. 6, 2017.

(51) Int. Cl.
*H01L 27/06* (2006.01)
*H01L 31/06* (2012.01)
*H01L 31/102* (2006.01)

(52) U.S. Cl.
CPC .......... *H01L 27/0676* (2013.01); *H01L 31/06* (2013.01); *H01L 31/102* (2013.01)

(58) Field of Classification Search
CPC ..... H01L 27/0676; H01L 27/24; H01L 27/30; H01L 31/102; H01L 31/09; H01L 31/06; H01L 45/00
See application file for complete search history.

(56) References Cited

U.S. PATENT DOCUMENTS 6,140,924 A    10/2000  Chia et al.
6,423,981 B1 *  7/2002  Nayler ............... G01R 1/28
                                                          257/48

(Continued)

OTHER PUBLICATIONS

International Search Report for PCT/IL2018/050253, dated Jun. 7, 2018; 4 pages.

(Continued)

*Primary Examiner* — Vongsavanh Sengdara
(74) *Attorney, Agent, or Firm* — Pearl Cohen Zedek Latzer Baratz LLP

(57) ABSTRACT

A novel electric rectifier for use in a rectenna device is provided. The rectenna device can advantageously be used in a variety of applications. The electric rectifier comprises an integrated structure comprising: a diode structure comprising first and second electrodes located in first and second conductive layers respectively and an insulating layer between them, the diode structure being configured and operable for receiving an input signal and generating output signal indicative thereof, and a compensation structure electrically connected in parallel to said diode structure and being configured to compensate the parasitic capacitance of the diode structure when a frequency spectrum of the input signal is beyond the diode's cutoff frequency.

19 Claims, 19 Drawing Sheets

(56) References Cited

U.S. PATENT DOCUMENTS

| | | | | |
|---|---|---|---|---|
| 7,799,988 | B2* | 9/2010 | Cutler | B82Y 10/00 |
| | | | | 136/255 |
| 8,115,683 | B1* | 2/2012 | Stefanakos | H01Q 1/248 |
| | | | | 343/700 MS |
| 8,436,337 | B2 | 5/2013 | Cowell, III et al. | |
| 8,822,978 | B2 | 9/2014 | Cowell, III et al. | |
| 2010/0289005 | A1* | 11/2010 | Cowell, III | H01L 29/732 |
| | | | | 257/29 |
| 2011/0220959 | A1 | 9/2011 | Blick et al. | |
| 2013/0162333 | A1* | 6/2013 | Colli | H01L 31/1085 |
| | | | | 327/535 |
| 2014/0070808 | A1* | 3/2014 | Reykowski | G01R 33/3657 |
| | | | | 324/309 |
| 2014/0085148 | A1* | 3/2014 | Cutler | H01L 31/1085 |
| | | | | 343/701 |
| 2014/0191197 | A1* | 7/2014 | Cowell, III | H01L 29/7311 |
| | | | | 257/29 |
| 2016/0359374 | A1* | 12/2016 | Fujimoto | H02J 7/025 |

OTHER PUBLICATIONS

Written Opinion of the International Searching Authority for PCT/IL2018/050253, dated Jun. 7, 2018; 4 pages.

Etor, D. Dodd, L. E., Wood, D., & Balocco, D. (Aug. 2015). Impedance matching at THz frequences: optimizing power transfer in rectennas, In Infrared, Millimeter, and Terahertz waves IRMMW-THz), 2015 40th International Conderence on (pp. 1-2), IEEE (3 pages).

Eliasson, B. J. (2001), Metal-insulator-metal diodes for solar energy conversion (Doctoral dissertation, University of Colorado) (228 pages).

Singh, Aparajita. Improving Current-Asymmetry of Metal-Insulator-Metal Tunnel Junctions: (2016) (128 pages).

Richard M. Osgood III et al., "Nanoantenna-coupled MIM nanodiodes for efficient vis/nir energy conversion", Sep. 13, 2007, vol. 6652, Proceedings of SPIE—The International Society for Optical Engineering.

Barnet R et al. "Design of Multistage Rectifiers with Low-Cost Impedance Matching for Passive RFID Tags", IEEE Radio Frequency Integrated Circuits (RFIC) Symposium, 2006, pp. 257-260.

Raymond E Barnett et al., "A RF to DC Voltage Conversion Model for Multi-Stage Rectifiers in UHF RFID Transponders", IEEE Journal of Solid-State Circuit, IEEE, USA, vol. 44, No. 2, Feb. 1, 2009, pp. 354-370.

Mahima Arrawatia et al., "An Integrated CMOS RF Energy Harvester woth Differential Microstrip Antenna and On-Chip Charger", VLSI Design (VLSID), 2012 25TH International Conference on, IEEE, Jan. 7, 2012, pp. 209-214.

European Search Report for PCT application No. EP18763785, dated Dec. 4, 2020.

* cited by examiner

State-of-the-art MIM diode parameters

| Reference | Type of MIM and Area (A) | Maximum responsivity ($V^{-1}$) | Zero bias responsivity ($V^{-1}$) | Zero bias resistance $R_0$ (Ohm) | Oxide thickness (nm) |
|---|---|---|---|---|---|
| Hoofring 1989[45] | Thin film Ni-NiO-Au (0.64 µm²) | 5.5 | 2.8 | -- | 2.2 |
| I. Wilke, et. al 1994[33] | Ni-NiO-Ni (0.0576 µm²) | 1.6 | -- | 100 | 4 |
| M. Abdel-Rahman et al. 2004[46] | Thin film Ni-NiO-Ni (0.075 µm² and 0.0014 µm²) | 2.75 and 1.65 respectively | -- | 180 | 3.5 |
| Esfandiari 2005[47] | Thin film Ni-NiO-Pt (0.0025 µm²) | ~13 | ~3 | -- | 2 |
| S.Krishnan et al. 2008[30] | Thin film Ni-NiO-cr/Au (1 µm²) | 5 | 1 | 500 K | 3 |
| Choi et. al 2010[48] | polysilicon-SiO2-polysilicon(60 nm²) | ~31 | 12 | -- | 1.38 |
| Dagenais et al. 2010[32] | Thin film polysilicon-SiO2-Au (0.35 µm²) | ~14.5 | 2.5 | 120 M | 60 |
| Bean et al. 2011[49] | Thin Al-AlOx-Pt (0.5625 µm²) | ~2.3 | 0.5 | 220 K | 0.6 |
| Zhang et al. 2013[31] | Ni-NiO-Cu (0.008 µm²) | 7.3 | -- | 1.2 M | 2 – 12 |
| Kinzel et al. 2013[34] | Al-Al2O3-Pt (0.008 µm²) | 0.03 | $1.24 \times 10^{-3}$ | 124.6 | 2 |
| Zhu et al. 2013[50] | Graphene-Air-Graphene | 0.24 | 0.12 | -- | -- |
| M.N. Gadalla et.al.2014 | Cu-CuO-Au (0.0045 µm²) | 6 | 4 | 505 | 0.7 |

Fig. 3

INTEGRATED RECTIFIER

CROSS-REFERENCE TO RELATED APPLICATIONS

This application is a National Phase Application of PCT International Application No. PCT/IL2018/050253, International Filing Date Mar. 6, 2018, claiming the benefit of U.S. Provisional Application No. 62/467,361, filed Marc. 6, 2017, which are hereby incorporated by reference.

TECHNOLOGICAL FIELD

The present invention is in the field of optoelectronics, in particular in electric rectification of electromagnetic radiation.

BACKGROUND

Solar energy is the largest energy source on earth. Solar energy collection is growing rapidly today and is expected to compete with conventional electrical energy generation in the near future. Solar energy harvesting is based on optical rectenna structures, which basically comprises a nanoantenna and a diode rectifier (e.g. a Metal-Insulator-Metal (MIM) diode), destined for the direct solar energy conversion into electricity. One of the main difficulties preventing the proliferation of the rectenna structures is efficiency. The reported conversion efficiency for the existing rectenna structures is only 0.01%, despite the estimated theoretical conversion efficiency of about 86%.

The main reason of the extremely low conversion efficiency of the rectenna is the extra-large value of parasitic capacitor of the rectifying MIM diode.

One of the currently explored directions for compensating the parasitic capacitance of the diode is the use of point-contact diodes. Point-contact diodes are made from a thin nanowire arranged against a strip of oxidized metal. Usually the point-contact diode performs a rectenna wherein the thin nanowire acts as nanoantenna and the nanowire tip together with a strip of the oxidized metal acts as a rectifier for IR and optical radiation. Depending on the metal types the nanowire tip performs a cathode function and the strip of oxidized metal serves an anode function. In some examples, the rectenna may use a very small, nano-size, vacuum gap, e.g. 1 nm, instead of dielectric insulator, in which case the tunnel junction is provided by metal-vacuum-metal (MVM) structure.

Another known direction for compensating the parasitic capacitance of the diode is the carbon nanotube (CNT) optical rectenna, which consists of vertical nanowires/CNTs on planar substrates with a point contact-like rectifying junction. The device uses wavelength-dependent sized vertical arrays of nanostructures with point contact-like junctions. The nanowire or metal CNT (mCNT) operates as nanoantennas. The nanowire or mCNT tip forms a MVM or MIM junction barrier. Charge transport through the barrier is via tunneling. Due to the asymmetry in these tunneling barriers, a positive net DC current is delivered to an external circuit.

GENERAL DESCRIPTION

The present invention provides a novel integrated structure of a highly efficient rectifying metal-insulator-metal diode (MIM diode, e.g. planar MIM diode), which operates with high efficiency by compensating the intrinsic parasitic capacitance of the MIM diode, in the frequency range used. In particular, the novel diode structure is configured especially for use with high-frequency operational optical spectrum, such as infrared (IR), visible (VIS) and ultraviolet (UV) spectrum. The intrinsic parasitic capacitance impacts on the cutoff frequency of a planar MIM diode, which operates as a low pass filter. The novel diode structure of the invention operates with frequencies higher than its cutoff frequency and accordingly, the diode structure of the invention can be used as the rectifier in an optical rectenna for effectively converting electromagnetic radiation, i.e. photons, into DC electrical current, such as converting incident solar energy to DC electrical current. As will be further described below, the invention can be useful in a wide variety of industrial and medical applications, ranging from solar energy harvesting, digital imaging, infrared sensing and others.

The previously explored attempts to compensate the parasitic capacitance suffer from various weaknesses. The point-contact diode structures and vertically mCNT structures have very low efficiency at IR and VIS frequencies because the tunnel junction resistance, being inversely proportional to the tunnel junction area, is very high (e.g., on the order of 1 T$\Omega$ for mCNT). Also, the cutoff frequency remains low. Further, the point-contact diode structures are not suitable for commercial manufacturing because the point-contact diodes requirement for gap is in range of 1 nm which is not available in the present fabrication nanotechnology. The vertical mCNT structures are also not suitable for commercial manufacturing as optical antennas because the length-to-diameter ratio should be in range from 200:1 to 400:1, while the diameter is in range 0.6÷5 nm.

The planar MIM diode is relatively easy manufactured and therefore it is preferable for the semiconductor industry.

The conventional MIM diode equivalent electrical circuit diagram, which is used for the analysis of the MIM diode performance and operation inside the electrical circuits, includes a resistor in parallel with an intrinsic parasitic capacitor. When the conventional MIM diode is subjected to high-frequency input signal, the parasitic capacitance, namely the reactive resistance of the capacitor, is much smaller than the active resistance of the resistor, and as a result, the circuit operation is bi-directional.

The present invention solves this by modifying the conventional MIM structure through the introduction of an artificial inductor and an artificial capacitor (typically MIM capacitor), which are connected in series, to thereby create a resonance circuit having a parallel resonance condition, with the parasitic capacitance, for the predetermined electromagnetic spectrum and in which the parasitic capacitance is neutralized, thus keeping the directional operation of the electrical circuit while under the resonance condition. The novel MIM diode is occasionally called herein the Asymmetric MIM Diode Structure (AMIM-DS), because of its asymmetric geometry.

More particularly, the electrical resonance occurs in two modes: (a) series resonance at frequencies lower than infrared (IR) and visible (VIS) range, and (b) the parallel resonance at IR and VIS frequencies. The series resonance dominant frequency corresponds to the series connection of the artificial inductor and the artificial MIM capacitor. The parallel resonance dominant frequency corresponds to the parallel connection between the artificial inductor and the equivalent capacitor, which is the product of the series connection between the artificial MIM capacitor and the MIM diode parasitic capacitor. Since the capacitance of the artificial MIM capacitor is more than the capacitance of the equivalent capacitor, the series resonance dominant frequency is much lower than the VIS and IR ranges of the solar spectrum and does not impact the AMIM-DS efficiency at the VIS and IR ranges.

As a result, the circuit, which comprises the series connection of the artificial inductor and the artificial capacitor, is connected in parallel to the MIM diode of the conventional configuration. Moreover, the artificial capacitor prevents the backward discharge of the rectified direct current (DC) voltage via active resistance of the artificial inductor. Introducing an artificial capacitor therein enables to make the artificial inductor with more inductance that (a) increases the quality factor of the resonant circuit, which in turn increases the AMIM-DS conversion efficiency, and (b) facilitates the fabrication of the artificial inductor, which is suitable for nanofabrication technology.

It should be noted, that the serial arrangement of the artificial inductor and capacitor is bidirectional or exchangeable, i.e. each of them can be connected to the diode's anode or cathode while the other is connected to the diode's cathode or anode respectively.

Accordingly, the AMIM-DS of the invention is an integrated structure of a tunnel MIM diode having the layout of the metal and insulator layers (geometry and relative accommodation of associated metal regions and insulator region there between), which comprises an intrinsic parasitic capacitor, and which additionally comprises a series connection of an artificial inductor with an artificial capacitor, thus defining a resonance circuit configuration.

Thus, according to a broad aspect of the invention there is provided an electric rectifier for use in a rectenna device, the electric rectifier comprising an integrated structure comprising:
- a diode structure comprising first and second electrodes located in first and second conductive layers respectively and an insulating layer between them, the diode structure being configured and operable for receiving an input signal and generating output signal indicative thereof; and
- a compensation structure electrically connected in parallel to the diode structure and being configured to compensate the parasitic capacitance of the diode structure when a frequency spectrum of the input signal is beyond the diode's cutoff frequency.

In some embodiments, the compensation structure provides electric resonance with the diode structure at an intended frequency of the input signal.

In some embodiments, the diode structure is asymmetric such that the first and second conductive layers have different first and second work functions respectively.

In some embodiments, the first work function is larger than the second work function when electric current flows through the diode from the second electrode to the first electrode. The first conductive layer can be made from adjacent regions of aluminum and platinum and the second conductive layer can be made from aluminum.

In some other embodiments, the second work function is larger than the first work function when electric current flows through the diode from the first electrode to the second electrode. The second conductive layer can be made from adjacent regions of aluminum and platinum and the first conductive layer can be made from aluminum.

In some embodiments, the compensation structure comprises an inductor and a capacitor connected in series and both configured to resonate at the dominant frequency of the input signal. The inductor can be configured as a bended strip, and/or can be made from a material of the first or second conductive layers, and/or can be located in the first or second conductive layers.

In some embodiments, the capacitor comprises first and second conductive plates located in the first and second conductive layers respectively and interspaced by an insulator. The first and second conductive plates can be made from a material of the first conductive layer when electric current flows through the diode from the first electrode to the second electrode, or from a material of the second conductive layer when electric current flows through the diode from the second electrode to the first electrode. The insulator of the capacitor can be located in the insulating layer of the diode structure.

In some embodiments, each of the first and second conductive layers can be made from metal, metamaterial, material having a permittivity with a negative real part in the frequency of the input signal, or any combination thereof.

In some embodiments, the insulating layer can be made from aluminum oxide ($Al_2O_3$).

In some embodiments, the electric rectifier can further comprise a dielectric layer beneath the first conductive layer. The dielectric layer can be made from silica.

In some embodiments, the electric rectifier can further comprise a silicon substrate layer beneath the dielectric layer.

In some embodiments, the frequency of the input signal corresponds to infrared, visible or ultraviolet light spectrum.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 3 illustrates the parameters of the contemporary state-of-the-art MIM diodes;

DETAILED DESCRIPTION

Figure 1:
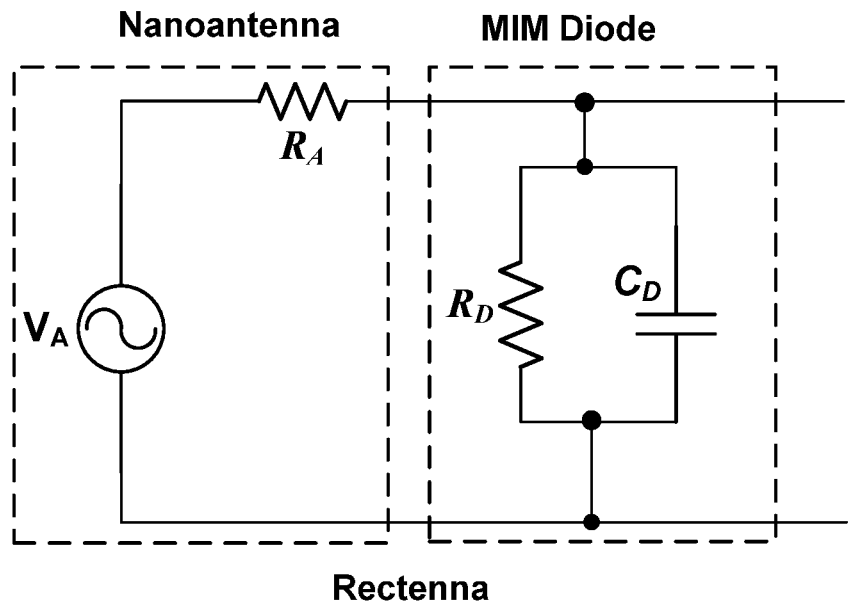
FIG. 1 illustrates the equivalent electrical circuit diagram of the rectenna with the rectifying MIM diode.

Reference is made to FIG. 1 showing the equivalent electrical circuit diagram of the rectenna with a conventional rectifying MIM diode. The nanoantenna is modeled as an alternated current (AC) voltage source $V_A$ in series with a nanoantenna resistance $R_A$. The MIM diode is modeled as a resistor $R_D$ in parallel with an inhered parasitic capacitor $C_D$.

For the electrical signal, which is generated by $V_A$, in a forward direction the resistance $R_D$ must be low for permitting the electrical current to flow through. For the electrical signal, which is generated by $V_A$, in a reverse direction the resistance $R_D$ must to be high for preventing the electrical current to flow. Due to the $R_D$ difference for forward and reverse directions the AC electrical current rectification is provided.

Figure 2A:
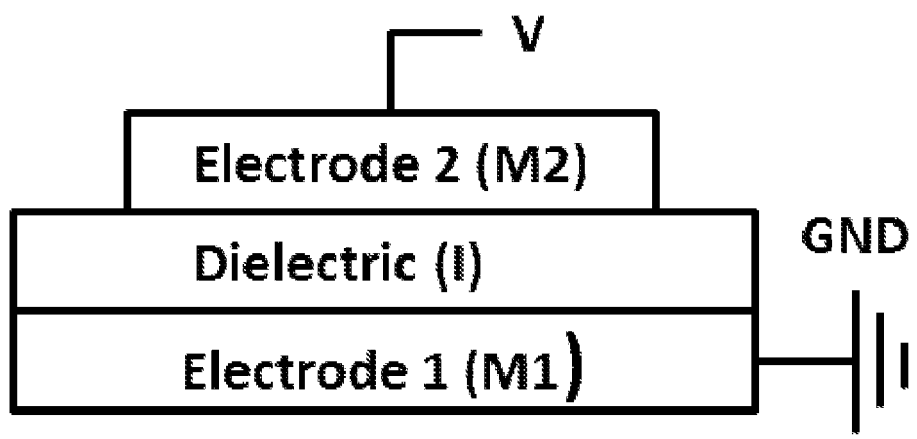
FIG. 2a illustrates the schematic cross section of a conventional MIM diode.

Reference is made to FIG. 2a illustrating an example of a planar MIM diode structure classical structure, such as described in U.S. Pat. Nos. 8,436,337 and 8,822,978. Planar MIM diode structure describes the electronic structure, which includes: (a) a first metal layer; (b) a second metal layer; (c) and at least one insulator layer located between the first metal layer and the second metal layer, wherein at least one of the metal layers comprises an amorphous multi-component metallic film. In certain embodiments, the construct is a metal-insulator-metal (MIM) diode.

Figure 2B:
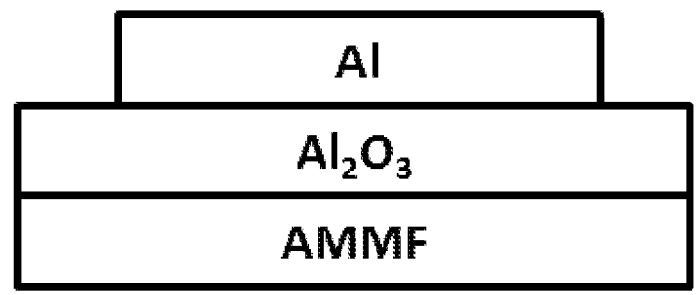
FIG. 2b illustrates the schematic cross section of yet another conventional MIM diode.

Another example of the planar MIM diode structure embodiment according to U.S. Pat. Nos. 8,436,337 and 8,822,978 is illustrated in FIG. 2b. Actually, the planar MIM diode construction is completely similar to a parallel-plate capacitor.

The cutoff frequency fc for a planar MIM diode is defined $fc=1/(2\pi R_D C_D)$. The cutoff frequency fc is independent of contact area for a planar MIM geometry since $C_D$, the capacitance of the contact, is proportional to A, the contact area, whereas $R_D$, the resistance is inversely proportional to A. The smaller is $R_D$—the better is the MIM diode rectification efficiency, but the greater is the inhered parasitic capacitor $C_D$. The analysis of equation $fc=1/(2\pi R_D C_D)$ shows that either $R_D$ or $C_D$ must be minimized. During last decades the MIM diode resistance reduced from mega Ohms to several hundred Ohm. However due to the presence of an amorphous insulating layer in the MIM diode, the resistance cannot be exclusively small and its minimal value is restricted. For example, the contemporary state of the art MIM diodes reached $R_D$ in range of 100-500 Ohm at a zero voltage bias that is illustrated on FIG. 3. These four MIM diodes had the contact area in range from 0.0576 μm² to 0.0045 μm². The MIM diode capacitance is calculated according to the equation $$C_D = \frac{\varepsilon 0 \varepsilon r A}{d},$$

where $\varepsilon 0 \approx 8.854 \times 10^{-12}$ [farad per meter or F/m] is the permittivity of vacuum, εr is the relative permittivity of the insulator material, A is area of MIM diode and d is the insulator thickness. The calculation shows that:

(a) For MIM diode with resistance $R_D$ equal to 100 Ohm and area of 0.0576 μm², the parasitic capacitance $C_D$=0.68 fF (femto Farad). Consequently the fc corresponds to 2.3 THz.

(b) For MIM diode with resistance $R_D$ equal to 505 Ohm and area of 0.0045 μm², the parasitic capacitance $C_D$=0.052 fF. Consequently the fc corresponds to 6.1 THz.

Solar radiation infrared spectrum, which reaches the earth surface, begins from about 120 THz. The visible spectrum corresponds to a band in the vicinity of 430-770 THz. It's clear that the gap between actual and required cutoff frequency fc of the planar MIM diode junction is too large for rectification of the visible and infrared spectrum.

Accordingly, since in the MIM diode the resistance cannot be infinitely small, the parasitic capacitance $C_D$, which remains on the same order of magnitude, should be compensated.

Figure 4:
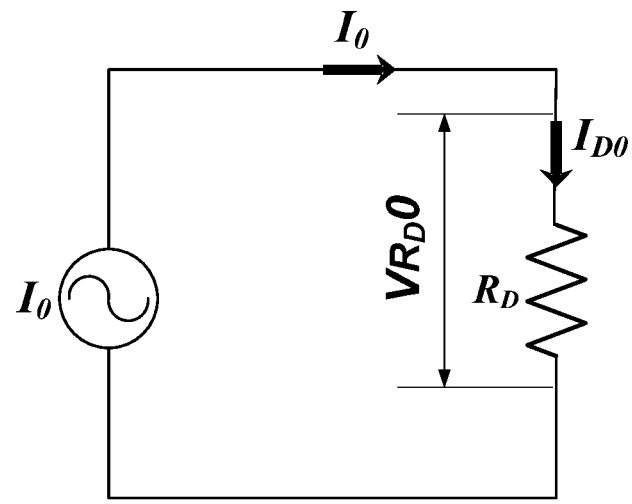
FIG. 4 illustrates the equivalent MIM diode electrical circuit diagram in the frequency range well below the cutoff frequency fc where the reactive resistance of the parasitic capacitor is negligible.

Reference is made to FIG. 4 which illustrates the equivalent MIM diode electrical circuit diagram in the frequency range well below the cutoff frequency fc where the reactive resistance of the parasitic capacitor is negligible. Here the reactive resistance $X_{CD}$ of the parasitic capacitor is much larger than $R_D$ ($X_{CD}$>>$R_D$). For the forward voltage direction the MIM diode performs an active resistor $R_D$.

Figure 5A:
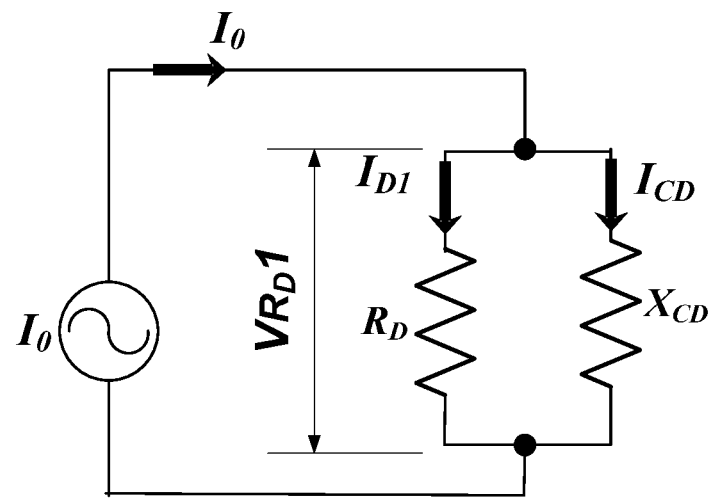
FIGS. 5a and 5b illustrate the equivalent MIM diode electrical circuit diagram in the frequency range beyond the cutoff frequency fc.
Figure 5B:
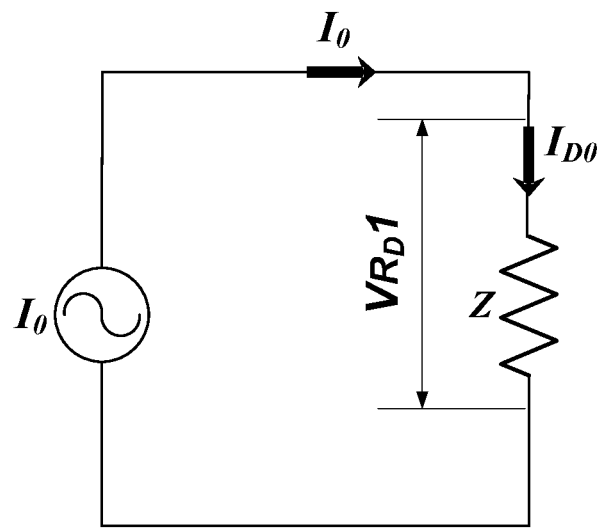

FIGS. 5a and 5b illustrate the equivalent MIM diode electrical circuit diagram in the frequency range beyond the cutoff frequency fc. Here, the reactive resistance $X_{CD}$ of the parasitic capacitor is connected in parallel to the active resistor $R_D$. At solar range $X_{CD}$<$R_D$. For a MIM diode the module of total equivalent impedance Z is calculated by equation:

$$Z = \frac{R_D X_{CD}}{R_D + X_{CD}}$$

Since at visible (VIS) and infrared (IR) frequencies the reactive resistance of the parasitic capacitance $X_{CD}$ is much less than the forward active resistance of the MIM diode ($X_{CD} \ll R_D$), the resulting alternating electrical current (AC) $I_{D0}$ will flow directly through the parasitic capacitance in both directions and will not be rectified.

Numerically it looks as follows. The reactive resistance of the parasitic capacitance $X_{CD}$ is calculated according to the equation: $X_{CD} = 1\omega C_D$, where $\omega$ is the angular frequency (in radians per second), which is calculated as $\omega = 2\pi f$. The frequency f is calculated as $f = c/\lambda$, where c is the light velocity in vacuum and $\lambda$ is the particular wavelength of the solar spectrum electromagnetic radiation in vacuum. The calculation shows that for MIM diode with resistance $R_D$ equal to 100 Ohm and area of 0.0576 μm² with the insulator thickness 4 nm and permittivity $\varepsilon r=4$, the parasitic capacitance reactive resistance $X_{CD}$ is equal to 0.67 Ohm for a red wavelength of 650 nm (f=461 THz).

In a range beyond the cutoff frequency, the MIM diode relative conversion efficiency $E_D$ is defined as a ratio of electrical power (or electrical current $I_{D1}$ squared) through $R_D$ beyond the cutoff frequency fc (i.e. at the solar spectrum range), when $X_{CD}$ is smaller or much smaller than $R_D$ in forward direction (i.e. $X_{CD} < R_D$ or $X_{CD} \ll R_D$), as seen in FIG. 5a, to the electrical power (or electrical current $I_{D0}$ squared) through $R_D$ well below the cutoff frequency fc when the reactive resistance $X_{CD}$ of the parasitic capacitor is much larger than $R_D$, see FIG. 4, (i.e. $X_{CD} \gg R_D$):

$$E_D = \left(\frac{I_{D1}}{I_{D0}}\right)^2$$

Accordingly, by using the active and reactive resistance values, the MIM diode relative conversion efficiency $E_D$ is calculated by equation:

$$E_D = \left(\frac{X_{CD}}{(X_{CD}^2 + R_D^2)^{0.5}}\right)^2 = \frac{X_{CD}^2}{X_{CD}^2 + R_D^2}$$

For a MIM diode with resistance $R_D$ equal to 100 Ohm and parasitic capacitance reactive resistance $X_{CD}$ equal to 0.67 Ohm, the relative conversion efficiency $E_D$ will be equal to $$E_D = \frac{0.67^2}{0.67^2 + 100^2} \approx 0.00004489$$

In percentage the conversion efficiency $E_D$ will be equal to 0.004489%.

Therefore, it is clear that beyond the cutoff frequency, i.e. at infrared and visible range, the MIM diode intrinsic parasitic capacitance dramatically reduces the conversion efficiency of the MIM diode. Consequently the MIM diode parasitic capacitance $C_D$ should be compensated.

Figure 6:
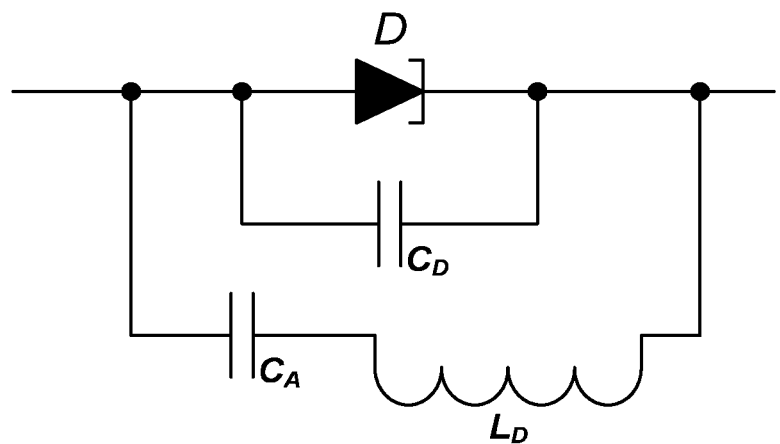
FIG. 6 illustrates the equivalent electrical circuit diagram of the electric rectifier including the ultra-efficient asymmetric metal-insulator-metal diode AMIM-DS model comprising the integrated additional artificial inductance and additional, artificial, MIM capacitor.

Reference is made to FIG. 6 illustrating the equivalent electrical circuit diagram of the ultra-efficient AMIM-DS model that comprises (a) the rectifying tunnel MIM diode D, (b) the MIM diode parasitic capacitor $C_D$ along with the (c) integrated additional artificial inductor $L_D$ and (d) integrated additional, artificial, MIM capacitor $C_A$. Two resonance types occur in the AMIM-DS: a series resonance and a parallel resonance. The series resonance dominant frequency corresponds to the series connection of the artificial inductor $L_D$ and the additional, artificial, MIM capacitor $C_A$. The parallel resonance dominant frequency corresponds to the parallel connection between the artificial inductor and the equivalent capacitor $C_E$, which is the product of the series connection between the additional, artificial, MIM capacitor $C_A$ and the MIM diode parasitic capacitor $C_D$. Since the capacitance of the additional, artificial, MIM capacitor $C_A$ is more than the capacitance of the equivalent capacitor $C_E$, the series resonance dominant frequency is much lower than the VIS and IR ranges of the solar spectrum and does not impact the AMIM-DS performance and efficiency at the VIS and IR ranges.

Moreover the additional, artificial, MIM capacitor $C_A$ prevents the discharge of the rectified and filtered DC voltage through the artificial inductance hack to the AC current source (e.g. to the nanoantenna).

Figure 7:
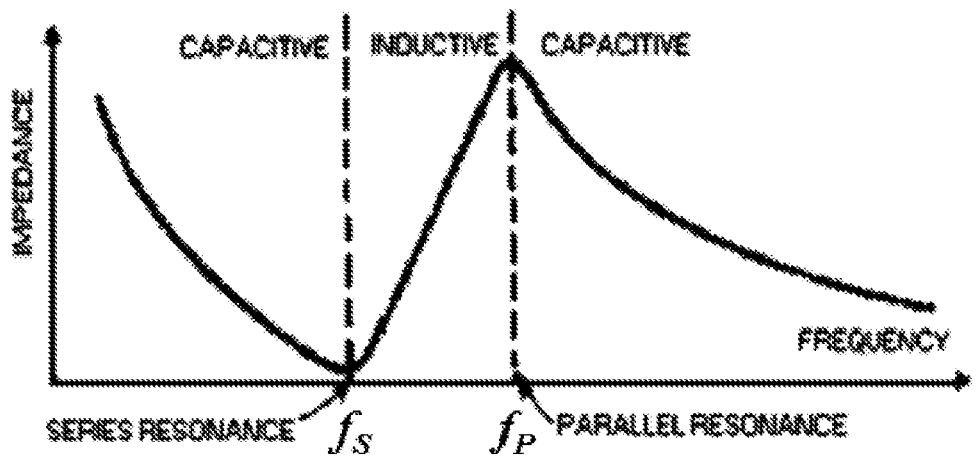
FIG. 7 illustrates the resonant characteristic of the integrated artificial resonant circuit.

Reference is made to FIG. 7 which depicts the AMIM-DS resonant characteristic. The parallel resonance dominant frequency $f_P$, which is calculated by equation:

$$f_P = \frac{1}{2\pi \sqrt{L_D \frac{C_D \times C_A}{C_D + C_A}}}$$

corresponds to the selected dominant frequency inside the optical range. The series resonance, which frequency $f_S$ corresponds to the series connection of $C_A$ and $L_D$, is arranged much lower than the selected dominant frequency $f_P$. The frequency $f_S$ calculated according the equation:

$$f_S = \frac{1}{2\pi \sqrt{L_D C_A}}$$

The resonant characteristic of the integrated artificial resonant circuit clearly illustrates that the frequency $f_S$ is arranged much lower than $f_P$, which is selected inside the VIS and NIR range of the solar spectrum, therefore the series resonance does not impact the AMIM-DS performance and efficiency at the selected optical range.

Figure 8:
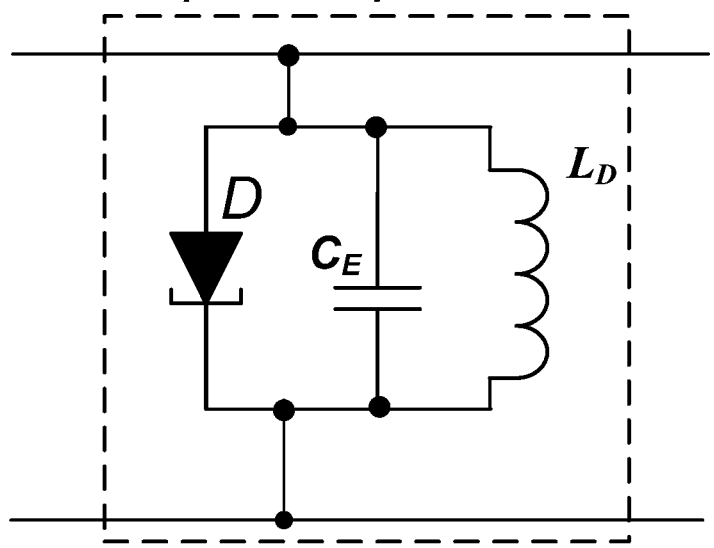
FIG. 8 illustrates the equivalent electrical circuit diagram of the ultra-efficient asymmetric metal-insulator-metal diode AMIM-DS model with the equivalent parallel capacitor $C_E$.

For facilitating the analysis of the equivalent electrical circuit diagram, which is depicted in FIG. 7, the $C_D$ and $C_A$ shall be converted into a single equivalent parallel capacitor $C_E$ according equation:

$$C_E = \frac{C_D C_A}{C_D + C_A}$$

where $C_E$ is connected in parallel to the rectifying tunnel MIM diode D and additional artificial inductance $L_D$ as it is depicted in FIG. 8.

It is well known that during the parallel resonance the electrical current through the capacitor is equal and opposite to the current through the inductor. Hence the current through the artificial inductor compensates the current through the equivalent parallel capacitor. Consequently the self-compensation of the parasitic capacitor $C_D$ is achieved.

Figure 9A:
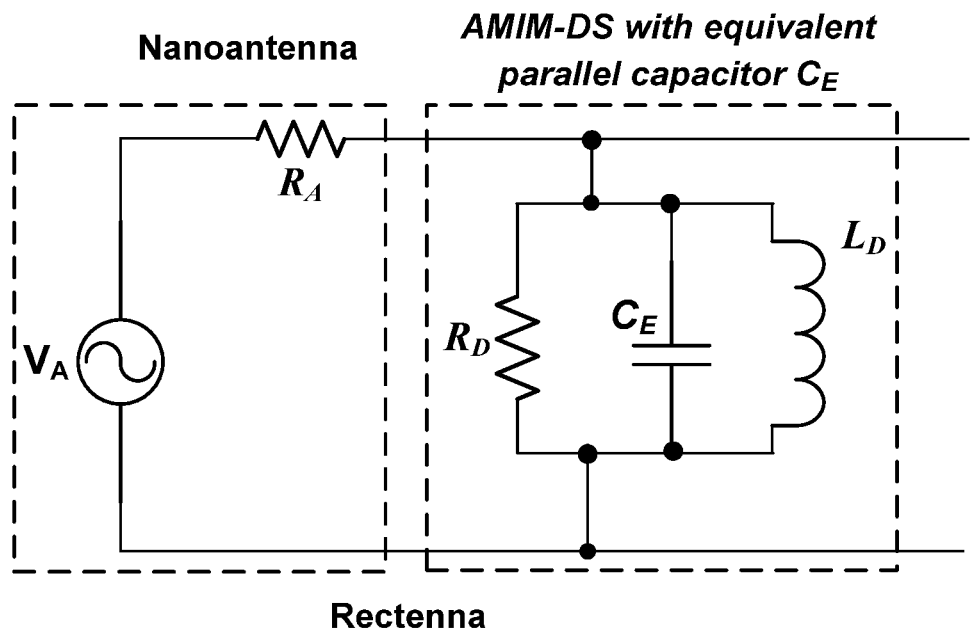
FIG. 9a illustrates the equivalent electrical circuit diagram of the rectenna, which comprises AMIM-DS with equivalent parallel capacitor $C_E$.
Figure 9B:
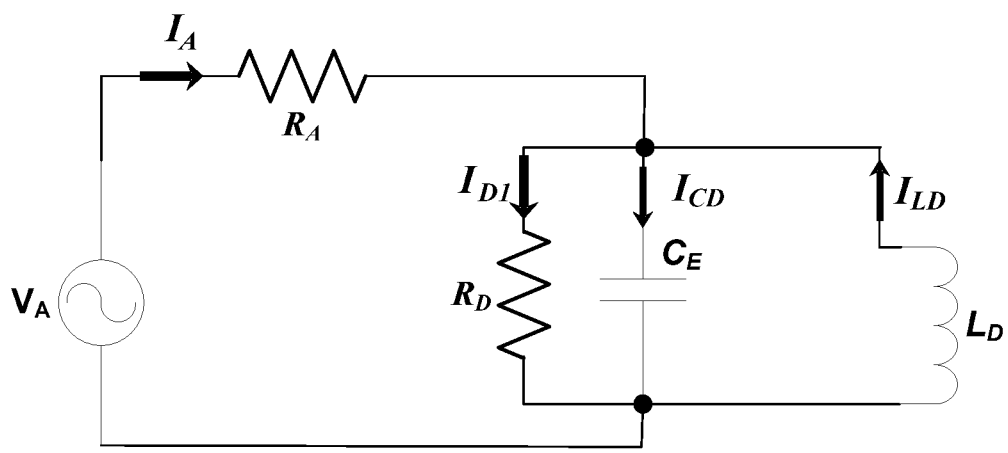
FIG. 9b illustrates the electrical current flow in AMIM-DS diode during the resonance.

FIG. 9a illustrates the equivalent electrical circuit diagram of the rectenna, which comprises the rectifying AMIM-DS, which has the equivalent parallel capacitor $C_E$. For further circuit analysis, the MIM diode D is modeled as a resistor $R_D$, which is equal to resistance of the MIM diode D in the forward direction. Hence, in FIG. 9a the AMIM-DS is modeled as a resistor $R_D$ with parallel arrangement of an equivalent parallel capacitor $C_E$ and the artificial inductance $L_D$. The nanoantenna is modeled as an alternated current (AC) voltage source $V_A$ in series with a resistance $R_A$. FIG. 9b illustrates the electrical current flow inside the AMIM-DS.

During the parallel resonance, when impedances $X_{CE}=-j/\omega C_E$ and $X_{LD}=j\omega L_D$, the electrical current will circulate inside $L_D C_E$-circuit and will not impact on the currents $L_A$ and $I_{D1}$. In other words, the electrical current through $L_D$ will compensate the electrical current through $C_E$, i.e. $I_{CD}=I_{LD}$. Consequently the negative effect of the parasitic capacitance $C_D$ will be compensated. Hence the AMIM-DS establishes the self-compensation of the parasitic capacitance $C_D$.

Figure 10A:
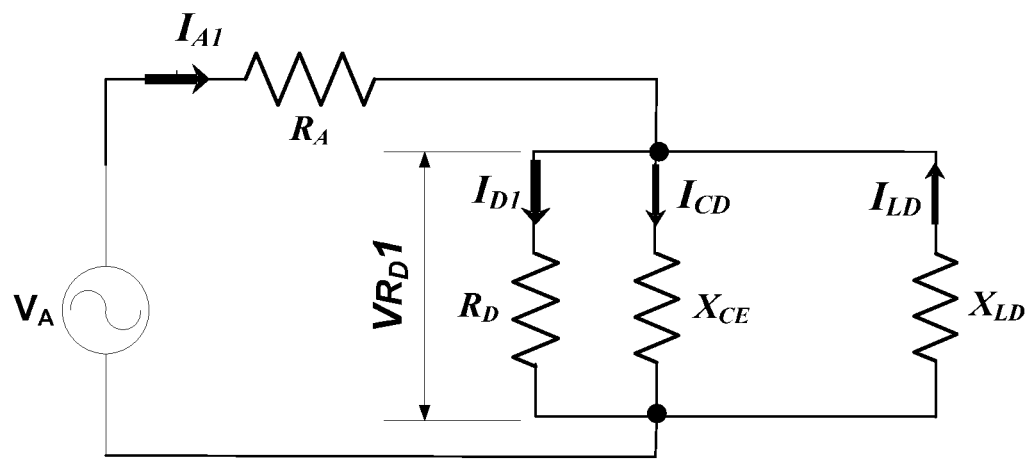
FIG. 10a illustrates electrical circuit diagram of rectenna with the AMIM-DS's reactive resistances $X_{CD}$ and $X_{LD}$ at the parallel resonance.
Figure 10B:
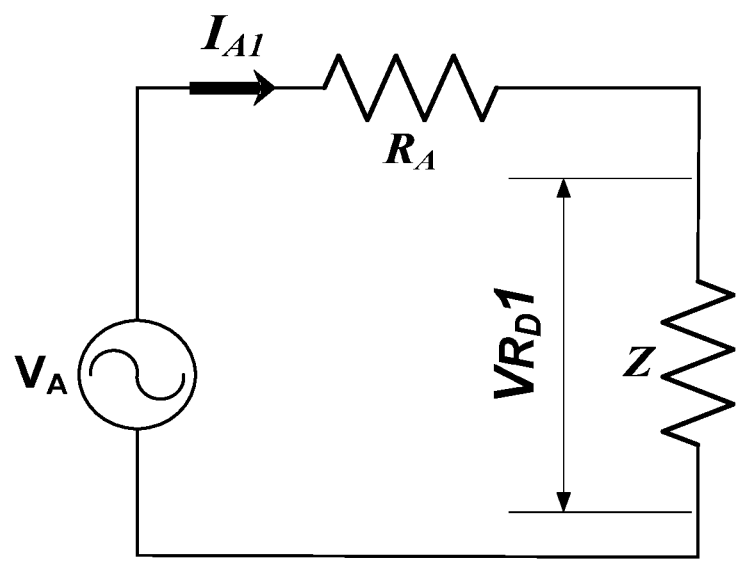
FIG. 10b illustrates electrical circuit diagram of the total equivalent impedance of the AMIM-DS connected in series with rectenna.

Reference is made to FIGS. 10a and 10b. FIG. 10a illustrates the rectenna of FIG. 9b but with the equivalent parallel capacitor $C_E$ and the artificial inductance $L_D$ depicted as the corresponding reactive resistances $X_{CE}$ and $X_{LD}$ connected in parallel with $R_D$.

FIG. 10b illustrates the rectenna electrical circuit diagram wherein $X_{CE}$, $X_{LD}$ and $R_D$ are substituted by the total equivalent impedance Z of the AMIM-DS.

The reactive resistances absolute values $X_{CE}$ and $X_{LD}$ are calculated according following well known equations:

$$X_{CE} = \frac{1}{\omega C_E} \text{ and } X_{LD} = \omega L_D$$

Where $\omega$ is the angular frequency (in radians per second), which is calculated as $\omega=2\pi f$, where the frequency f is calculated as a ratio of the electromagnetic wave velocity in vacuum divided on the wavelength of the selected dominant harmonic in IR and VIS range.

During the resonance the artificial inductor reactive resistance $X_{LD}$ must be equal to the capacitor reactive resistance $X_{CE}$:

$$X_{LD}=-X_{CE},$$

wherein sign minus denotes that electrical current flows in opposite direction.

For the resonant conditions, based on the above equations, the value of the artificial inductor $L_D$ is calculated as following:

$$L_D = \frac{1}{\omega^2 C_E}$$

The angular frequency $\omega$ must be selected near the peak energy of the solar spectrum. The module of total equivalent impedance Z of the AMIM-DS, which is illustrated in FIG. 10b, is calculated by equation:

$$Z = \frac{R_D}{1 + R_D \Big/ \frac{-X_{CE}X_{LD}}{X_{LD} - X_{CE}}}$$

According to the last equation, for the perfect resonant conditions when modules $X_{CE}=X_{LD}$ the total equivalent impedance Z of the AMIM-DS is equal to resistance $R_D$ that says that parasitic capacitance $C_D$ is completely compensated.

Without nanoantenna (i.e. "stand alone"), the AMIM-DS relative conversion efficiency $E_{AMIM}$ is defined as a ratio of electrical power (or electrical current $I_{D1}$ squared) through $R_D$ at a range beyond the cutoff frequency fc, where $X_{CD}$ is smaller or much smaller than $R_D$ (i.e. $X_{CE}<R_D$, or $X_{CE}<<R_D$) to the electrical power (or electrical current $I_{D0}$ squared) through $R_D$ of MIM diode at the range well below the cutoff frequency fc where the parasitic capacitor reactive resistance $X_{CD}$ is larger or much larger than $R_D$, (i.e. $X_{CE}>R_D$, or $X_{CE}>>R_D$) and thus negligible:

$$E_{AMIM} = \left(\frac{I_{D1}}{I_{D0}}\right)^2$$

The equation for AMIM-DS's relative conversion efficiency through the resistance values looks as following:

$$E_{AMIM} = \left(\frac{X_{CE}X_{LD}}{X_{CE}X_{LD} + X_{CE}R_D + X_{LD}R_D}\right)^2$$

For the perfect resonant condition at a range beyond the cutoff frequency fc when $X_{LD}=-X_{CE}$, the AMIM-DS relative conversion efficiency equal to 1 or 100%.

Well below the resonance frequency where $X_{LD}<<R_D$ as well as beyond the resonance frequency where $X_{CE}<<R_D$, the AMIM-DS relative conversion efficiency $E_{AMIM}<<1$.

On the other side, with the nanoantenna, the AMIM-DS' based rectenna relative conversion efficiency $E_{R\_AMIM}$ is defined as a ratio of electrical power (or current $I_{D1}$ squared) through $R_D$ at range beyond the cutoff frequency fc, where $X_{CD}$ is smaller or much smaller than $R_D$, see FIG. 9b and FIG. 10a, (i.e. $X_{CE}<R_D$, or $X_{CE}<<R_D$) to the electrical power (or current $I_{D0}$ squared) through $R_D$ of MIM diode (i.e. without artificial inductor $L_D$) at the range well below the cutoff frequency fc where the parasitic capacitor reactive resistance $X_{CD}$ is larger or much larger than $R_D$ (i.e. $X_{CE}>R_D$, or $X_{CE}>>R_D$). The equation for AMIM-DS's based rectenna relative conversion efficiency through the resistance values looks as the following:

$$E_{R\_AMIM} = \left(\frac{Z(R_A + R_D)}{R_D(R_A + Z)}\right)^2$$

According to the last equation, the AMIM-DS based relative rectenna conversion efficiency depends also on the nanoantenna resistance $R_A$ and the impedance matching between $R_A$ and $R_D$.

For the impedance matching, i.e. for $R_A=R_D$, and the resonant condition at a range beyond the cutoff frequency fc and for the RLC' circuit quality factor equal to 1, which means that $R_A=R_D=X_{LD}=X_{CE}$, the AMIM-DS based relative rectenna conversion efficiency equals to ~25%.

For the impedance matching, i.e. for $R_A=R_D$, and the resonant condition at a range beyond the cutoff frequency fc and for the RLC' circuit quality factor equal to 10, which means that $R_A=R_D=0.1 X_{LD}=0.1X_{CE}$, the AMIM-DS based rectenna relative conversion efficiency will be equal to 82.6%. It should be noted that the calculation of the $E_{R\_AMIM}$ relates to the one half of the period of the alternating electrical current.

Figure 11A:
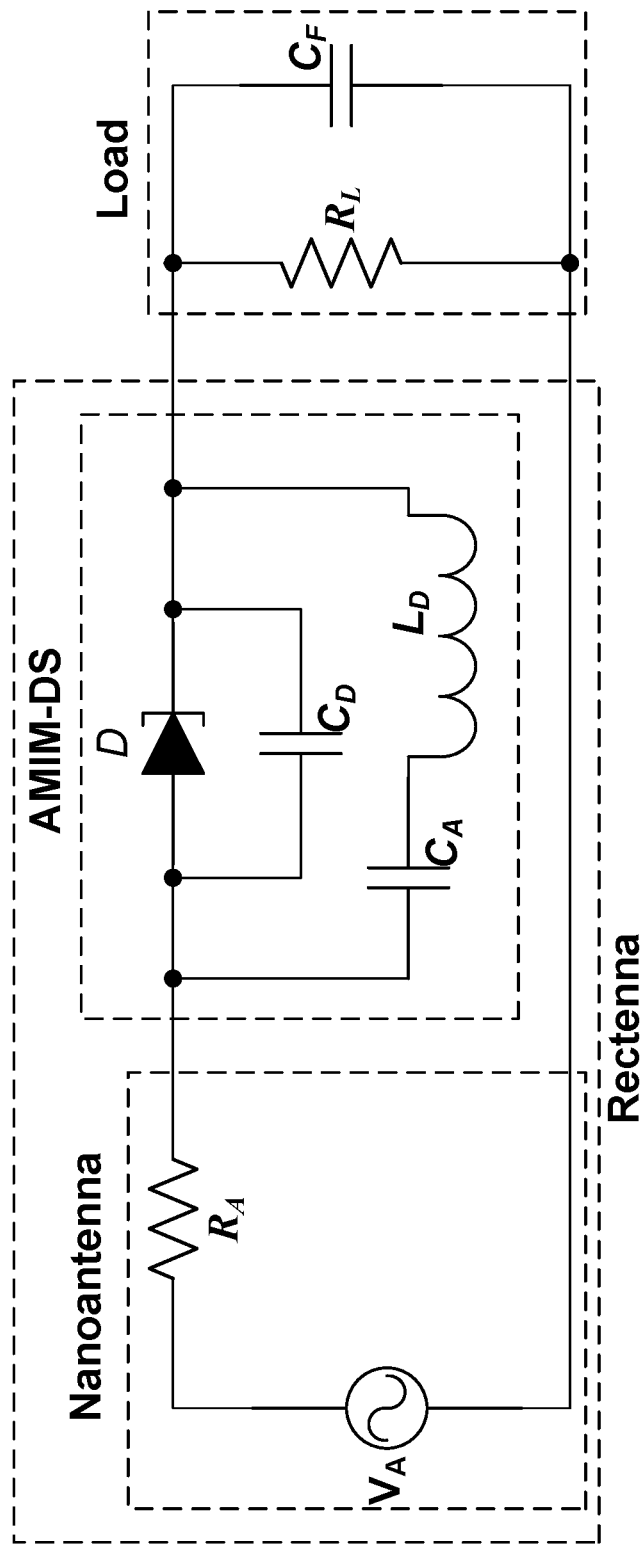
FIG. 11a illustrates the equivalent electrical circuit diagram of the rectenna model comprising the ultra-efficient asymmetric metal-insulator-metal diode (AMIM-DS) with load and filter capacitor.

Reference is made to FIG. 11a which illustrates the equivalent electrical circuit diagram of the rectenna model, which comprises AMIM-DS model connected with the load $R_L$ and the filter capacitor $C_F$. The nanoantenna model comprises an AC voltage source $V_A$ in series with a nanoantenna resistance $R_A$. The filter capacitor $C_F$ is required for smoothing and filtering the rectified half-period pulsing voltage on the load $R_L$.

Figure 11B:
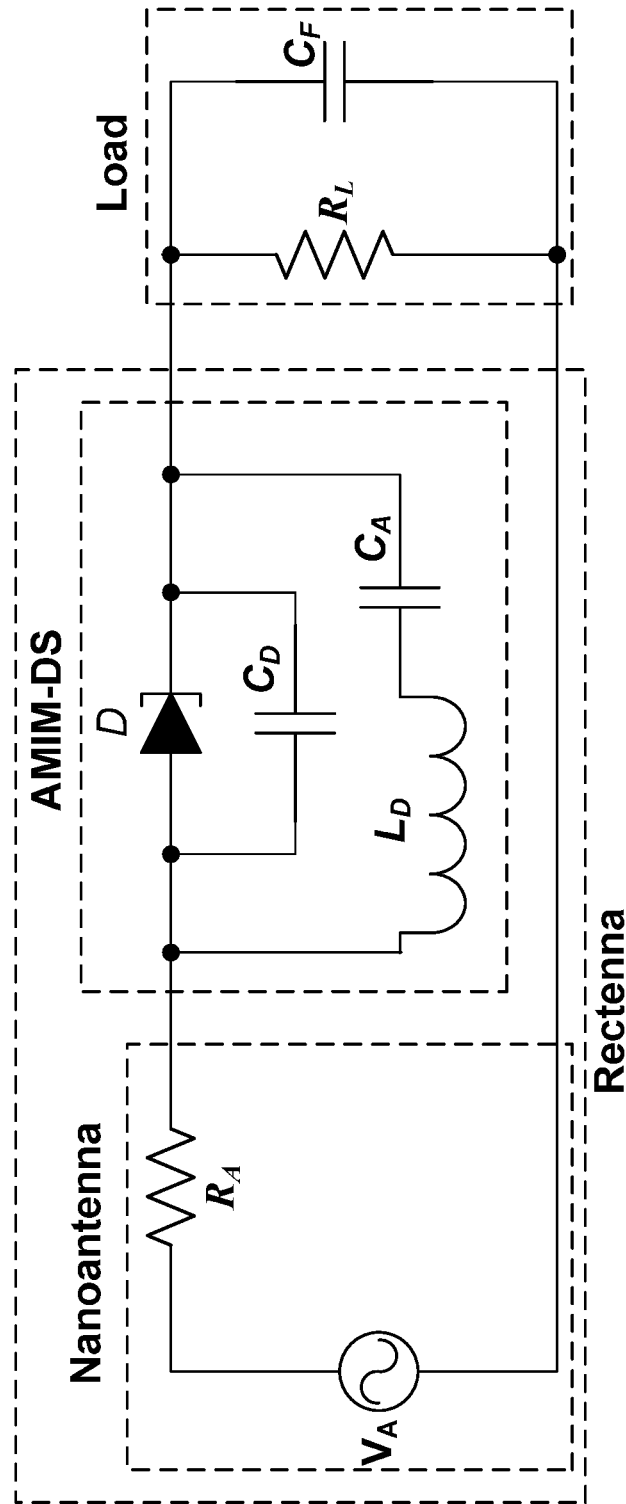
FIG. 11b illustrates the equivalent electrical circuit diagram of the rectenna model with swapped $C_A$ and $L_D$.

The additional, artificial, MIM capacitor $C_A$ prevents the discharge of the rectified and filtered DC voltage through the artificial inductance back to the AC current source (e.g. to the nanoantenna). The series connection of $C_A$ and $L_D$ is symmetrical: either $C_A$ or $L_D$ can be connected directly to the nanoantenna that does not impact the AMIM-DS model and the final AMIM-DS performance. FIG. 11b shows the swapped $C_A$ and $L_D$. The $C_A$ and $L_D$ free swap facilitates the AMIM-DS model specific construction (implementation), which shall be better suitable for the particular nanofabrication process and price reduction, as it is shown further in FIGS. 13, 14 and 16.

A non-limiting example of evaluation of values for additional, artificial, MIM capacitor $C_A$ and the lumped artificial inductor $L_D$ will be presented now. The calculation is made according to the equivalent electrical circuit diagram of the ultra-efficient asymmetric metal-insulator-metal diode AMIM-DS, as seen in FIG. 6.

(a) Initial Given Parameters

The evaluation is made for the AMIM-DS with following parameters:

The tunnel MIM diode D area $A=0.0045$ μm² (diameter about 75 nm or square 67×67 nm), insulator thickness $d=4$ nm, The relative permittivity of the insulator material (epsilon) $\varepsilon_r=2$.

(The epsilon is selected equal to 2 because for some dielectric materials, e.g. glass, the epsilon drops at optical frequencies).

The AMIM-DS forward resistance $R_D=100$ Ohm,

Central resonant wavelength $\lambda_0=650$ nm that corresponds to frequency $f_0=461.5$ THZ.

Required solar spectrum range $\Delta\lambda=\lambda_1-\lambda_2$ 1,950 nm–394 nm. Accordingly the frequency bandwidth BW will be: $BW=\Delta f=f_1-f_2=615$ THz, that corresponds to the RLC circuit quality factor $$Q = 0.75 \left( Q = \frac{f0}{f1-f2} \right).$$

(b) Calculation Results

The calculation results together with Initial Given Parameters are illustrated in the following Table:

| NN | Parameter | Symbol | Value | Unit | Note |
|----|-----------|--------|-------|------|------|
| | AMIM-DS forward resistance | $R_D$ | 100 | Ohm | Given Parameter |
| | The parasitic capacitance (femtoFarad) | $C_D$ | 0.0199 | fF | Calculated |
| | Central resonant wavelength | $\lambda_0$ | 650 | nm | Given Parameter |
| | Required solar spectrum bandwidth: | | | | |
| | Minimum | $\lambda_1$ | 390 | nm | Given |
| | Maximum | $\lambda_2$ | 1,950 | nm | Parameter |
| | The RLC circuit quality factor | Q | 0.75 | | Calculated according to the spectrum |
| | The inductance of the required artificial inductor (femtoHenry) | $L_D$ | 25.88 | fH | Calculated |
| | The required additional artificial capacitor | $C_A$ | 0.00598454 | fF | Calculated |
| | $C_A$ Area (for insulator thickness d = 4 nm and $\varepsilon_r$ = 2) | $A_{CA}$ | 0.001353 | μm² | Calculated |
| | $C_A$, Side of the square | a | 37 | nm | Calculated |
| | $C_A$, Diameter | D | 42 | nm | for either square or circle shape |

One of examples for the estimated topological dimensions of the artificial inductor is as shown in the following table:

| NN | Parameter | Symbol | Value | Unit | NOTE |
|----|-----------|--------|-------|------|------|
| | The inductance of the required artificial inductor | $L_D$ | 25.88 | fH | Given from the calculated in previous Table |
| | Diameter of the arc for the artificial inductor | D | 64 | nm | Approximated |
| | The arc length for the artificial inductor expressed in parts of an equivalent half-loop inductor with diameter D | $n_1$ | 0.2 ÷ 1.2 | | Approximated, see below. |
| | Equivalent Wire Diameter for the arc of the artificial inductor | d | 20 | nm | Calculated |

It should be noted that for the depicted example the shape of the artificial inductor is selected as a contour of a half loop inductor. Notwithstanding, the artificial inductor may be developed in any other contour including L-type, a straight or slightly bent strip.

In addition, the actual arc length may variate from 0.2 to 1.2 of a half loop length because the following factors are considered: (a) the effective wavelength scaling due to the existence of the plasmonic effect at optical wavelengths, particularly at 640 nm, (b) the arc length of an equivalent half-loop inductor is about 100 nm, that is comparable with approximately ⅒÷⅙ wavelengths with correction to wavelength scaling at the central resonant frequency of 640 nm, (c) the accuracy of the fabrication process, and (d) the surrounding metal surfaces. At practice the actual arc length, inside the tolerance of 0.2÷1.2 of a half loop length, must be calculated according to said factors, then tested and tuned for the final fabrication.

Figure 12A:
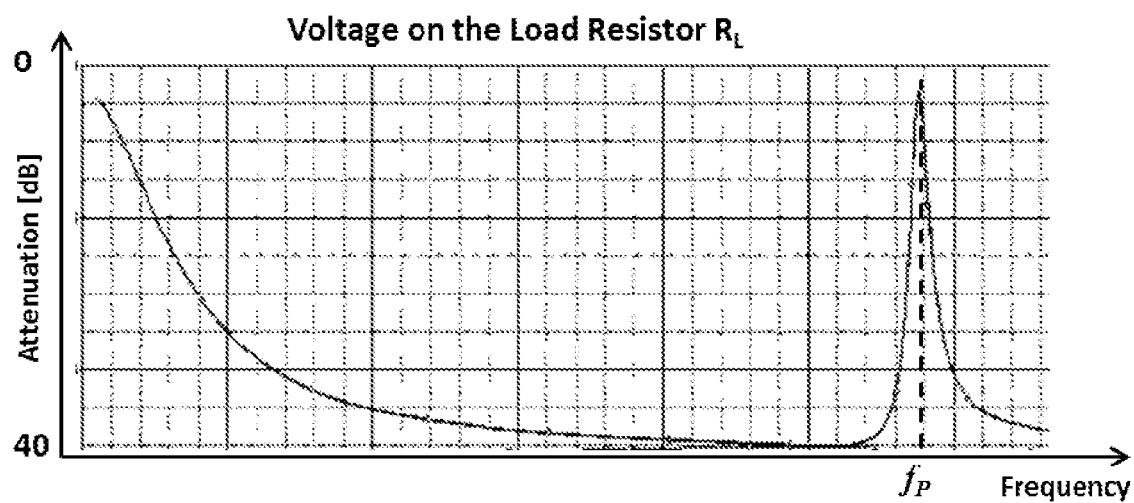
FIGS. 12a and 12b illustrate the voltage and power diagrams for AMIM-DS.

FIG. 12a illustrates the normalized simulated voltage transmission characteristic of the rectenna with AMIM-DS according to FIGS. 11a and 11b. Frequency $f_P$ corresponds to the frequency of parallel resonance that is calculated according equation $$f_P = \frac{1}{2\pi\sqrt{L_D \frac{C_D \times C_A}{C_D + C_A}}}.$$

Figure 12B:
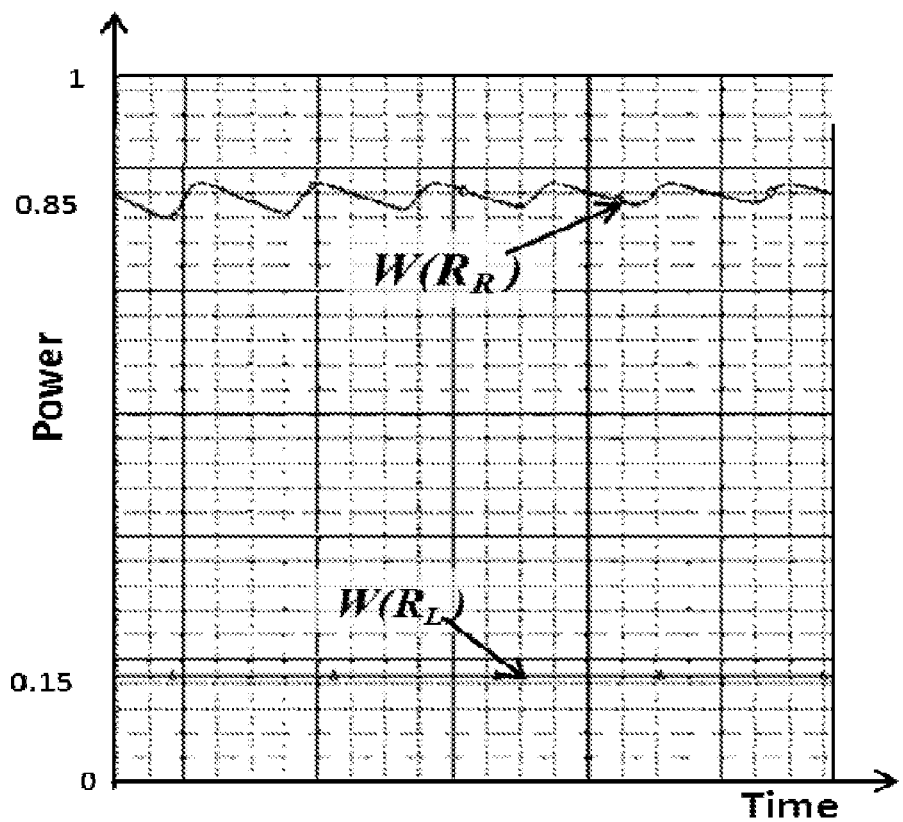

FIG. 12b illustrates the normalized simulated power distribution diagram between nanoantenna and load of the rectenna with AMIM-DS according to FIGS. 11a and 11b. Herein, the RMS power on the rectenna corresponds to curve $W(R_R)$ and the RMS power on load resistor $R_L$ corresponds to curve $W(R_L)$. $W(R_R)$ equals to the sum of RMS power on nanoantenna $R_A$ and RMS power on the AMIM-DS forward resistance, which is not shown separately on FIGS. 11a and 11b.

The rectenna absolute conversion efficiency E is defined from FIG. 11a or 11b, and it is the ratio of the power on load $R_L$, to the total received power on the rectenna, i.e. to the sum of RMS powers on rectenna and on load resistor $R_L$:

$$E = \frac{W(R_l)}{W(R_R) + W(R_l)}$$

According to simulated specific RLC parameters for the rectenna with AMIM-DS, the absolute conversion efficiency E is equal to 15%.

The equivalent electrical circuit diagram of the ultra-efficient asymmetric metal-insulator-metal diode AMIM-DS, which is depicted in FIG. 11a or FIG. 11b, is completely versatile. It means that for the nanofabrication, the AMIM-DS structure can be realized by many different constructions and layouts.

The AMIM-DS's upper deposited layer, which comprises (a) second non-insulating layer and (b) one of the output terminals, operates as a nanoantenna when the solar radiation falls on it.

Figure 13:
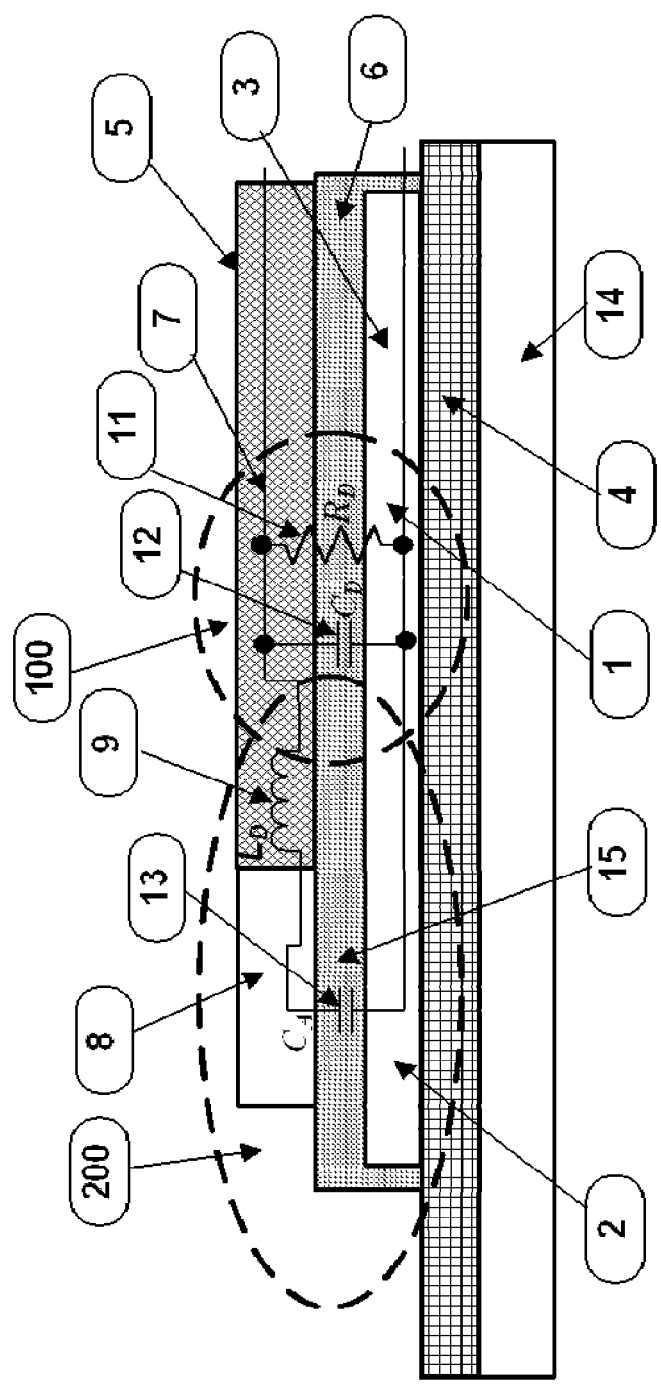
FIG. 13 illustrates the Cross section of the AMIM-DS construction, which is combined with the equivalent electrical AMIM-DS diagram.

Reference is made to FIG. 13 which illustrates a cross section of a non-limiting example of the electric rectifier of the present invention (i.e. the AMIM-DS device). As shown, the electric rectifier is an integrated structure which includes a diode structure 100 which includes first electrode 1 and second electrode 7 located in first and second conductive layers respectively and an insulating layer 6 between them. As appreciated from the above (e.g. FIG. 1), the structure 100 is a planar MIM diode which is electrically modeled as a resistor having resistance $R_D$ connected in parallel with an inhered parasitic capacitor having capacitance $C_D$. The diode structure 100 is configured and operable for receiving an input signal, e.g. via output terminal 5 and generating output signal indicative thereof. The device also includes a compensation structure 200 electrically connected in parallel to the diode structure 100 and configured to compensate the parasitic capacitance $C_D$ of the diode structure 100 when a frequency of the input signal is beyond the diode's cutoff frequency. Preferably, the electric rectifier is configured for converting solar energy to direct electric current, and so the frequency of the input signal is either in the infrared or visible range. The compensation structure 200 is aimed at providing resonance with the diode's structure such that the parasitic capacitance of the diode is compensated, resulting in highly efficient conversion and rectification.

As shown, the electric rectifier includes a substrate 14, which can be silicon or other suitable material in the semiconductor industry, a dielectric layer 4, such as Silica ($SiO_2$), on top of the substrate 14, and the diode 100 and compensation structures 200 on top of the dielectric layer.

As illustrated by different patterns in the figure, the diode structure is asymmetric such that the first and second electrodes, 1 and 7, have different first and second work functions respectively. If the second electrode 7 functions as the anode and the first electrode 1 functions as the cathode, i.e. such that the electric current flows from the second electrode to the first electrode in the diode structure, then the first work function is larger than the second work function. For example, the second layer is made from aluminum and the first layer from platinum. If the opposite is the situation, i.e. the electric current flows from the first electrode (the anode) to the second electrode (the cathode), then the second work function is larger than the first work function. In the latter case, the platinum and aluminum are exchanged.

The insulating layer 6 can be made from an amorphous insulating material, which can be an oxide of the material of the diode's anode. In the example where the anode is made from aluminum, the amorphous insulating layer 6 can be formed of aluminum oxide $Al_2O_3$.

As further shown in FIG. 13, the compensation structure 200 includes an artificial inductor 9 $L_D$ and an artificial capacitor 13 $C_A$ connected in series. It should be noted that the order can be inverted, such that the inductor 9 can be connected to the first electrode of the diode's structure. The inductor 9 can be of any structure known in the field. In the present example, it is constructed as a bended strip. The inductor itself can be made from the same material of the first electrode (first conductive layer) or the second electrode (second conductive layer) no matter where it is located.

In the described example, the capacitor 13 includes a first conductive plate 2, located in the first conductive layer and made from the same material (e.g. aluminum), and second conductive plate 8, located in the second conductive layer and made from the same material of the first conductive plate (the material of the first conductive layer). The first and second conductive plates are interspaced by an insulator 15, which can be located in and made from the same material of the insulating layer 6.

The first and second conductive plates, 2 and 8, can be typically made from the material of the first conductive layer, when electric current flows through the diode from the first electrode to the second electrode. Or, the first and second conductive plates can be made from the material of the second conductive layer when electric current flows through the diode from the second electrode to the first electrode.

Generally, the materials from which each of the first and second conductive layer are made are not limited to platinum and aluminum, as exemplified above, but can be made from any suitable conductive material, such as metal, metamaterial, material having a permittivity with a negative real part in the operational frequency, or any suitable combination thereof. In one example, when the first electrode is the anode, the first conductive layer can be made from aluminum (smaller work function) and the second conductive layer can be made from adjacent regions of platinum (larger work function) and aluminum. In another example, when the first electrode is the cathode, the second conductive layer can be made from aluminum and the first conductive layer can be made from adjacent regions of platinum and aluminum.

Figure 14:
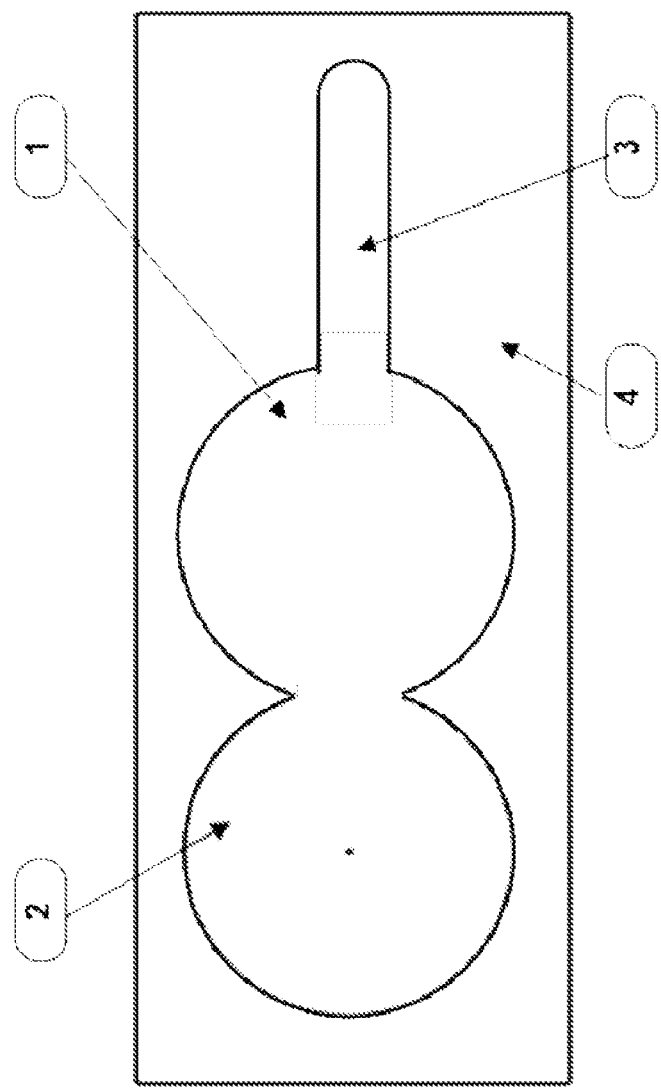
FIG. 14 illustrates the bottom layer of AMIM-DS construction diagram.

Reference is made to FIG. 14 which illustrates the bottom, first, conductive layer of the AMIM-DS device shown in FIG. 13. As can be seen, the output terminal 3, the first electrode 1 and the first plate 2 are located in the same first conductive layer and made from the same material, e.g. aluminum when the first electrode functions as an anode.

Figure 15:
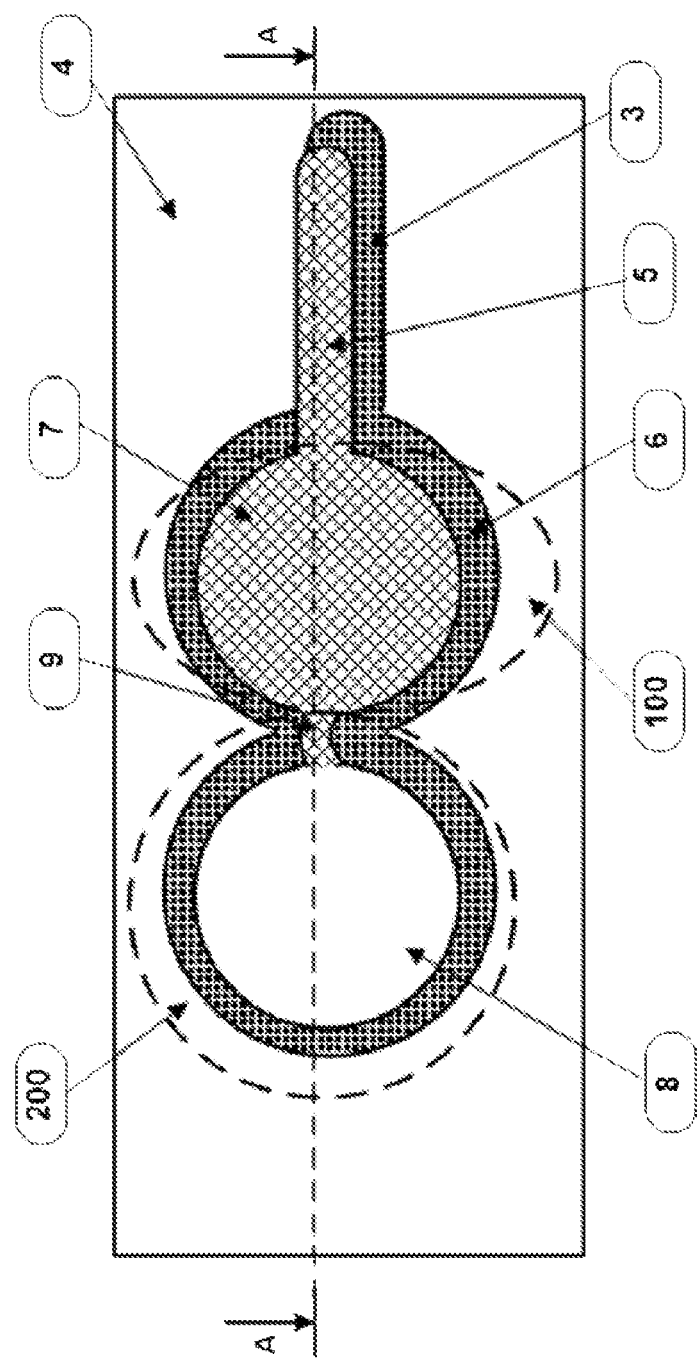
FIG. 15 illustrates the top view of the AMIM-DS construction diagram.

Reference is made to FIG. 15 which is a top view of the electric rectifier AMIM-DS device that corresponds to a cross section illustrated on FIG. 13. The second electrode 7 together with the output terminal 5 as well as the artificial inductor 9 are formed from a metal, which has a higher or lower work function than that of first conductive layer such that the device exhibits an asymmetry in the energy band diagram. The second conductive layer and the first conductive layer are located such that the transport of electrons includes, at least in part, transport by means of tunneling through the amorphous insulating layer 6 when the solar energy is incident on the nanoantenna, which can be the second conductive layer and/or the output terminal 5.

It should be noted that the shape of the first and second conductive layers is not limited and may be square, rectangular, triangular or any other. In the present example, the electrodes 1 and 7 and plates 2 and 8 are made as circles. Moreover, the shape of the electrodes can be the same or different from the shape of the plates. The shape and size of the first and second electrodes, the first and second plates, as well as the amorphous insulating thickness and permittivity must comply with electrical parameters of the equivalent electrical circuit diagram of the AMIM-DS model.

Figure 16:
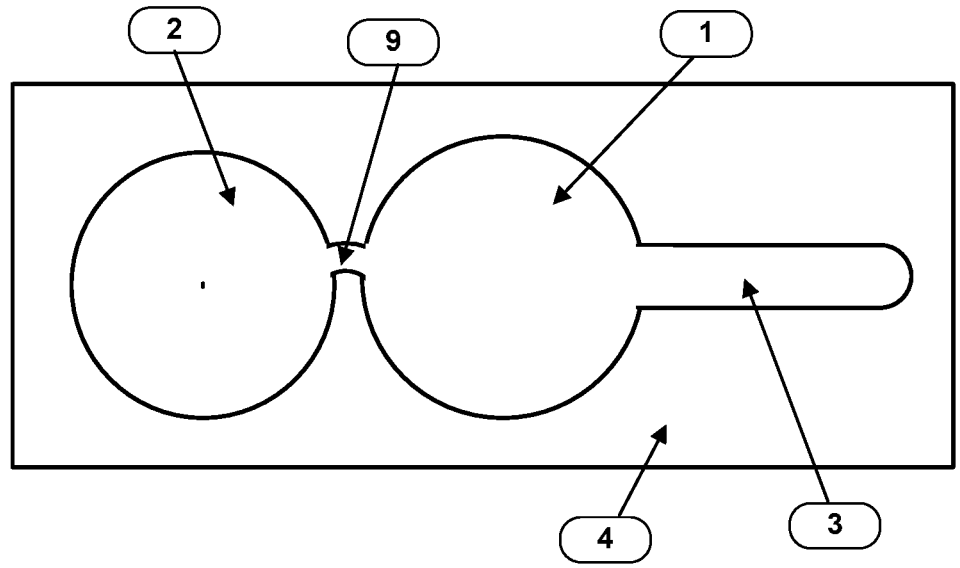
FIG. 16 illustrates the bottom layer with artificial inductor of a second embodiment of the AMIM-DS construction diagram.
Figure 17:
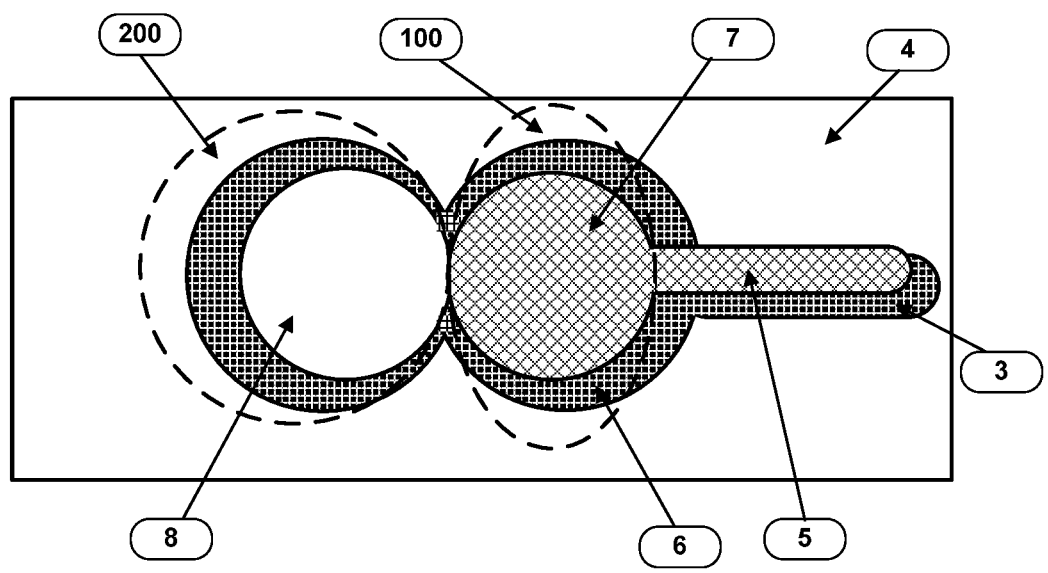
FIG. 17 illustrates the top view of the second embodiment AMIM-DS construction diagram.

Another non-limiting example of the electric rectifier of the present invention is shown in FIGS. 16-17 and corresponds to the electrical circuit diagram of FIG. 11*b*. Therefore, FIGS. 16 and 17 illustrate the electric rectifier with the artificial inductor implemented as a bended strip arranged on the bottom, first, conductive layer. The second conductive layer contains the second electrode 7 and the second conductive plate 8 that can be made from adjacent regions of platinum and aluminum. The specifications of this embodiment are clear from the FIGS. 16 and 17, and the numbers used indicate the same functional and/or structural parts as described in FIGS. 13-15.

The innovative AMIM-DS of the present invention can be usefully and advantageously used in a wide plurality of applications involving conversion of photons into electrons. As described above, one of the main applications is the rectification of solar energy into DC electric current. In the following, other important applications are described.

One application relates to digital imaging. The rectennas including the AMIM-DS can be successfully used as pixels in digital image sensors instead of the contemporary CMOS or CCD pixels based on photodiodes. The following two tables illustrate the results of calculation per one incident photon for the CCD image sensor pixel and for pixel with rectenna including the AMIM-DS taking in consideration only quantum theory. For CMOS image sensor pixel, the sensitivity gain will be approximately of the same order of magnitude, as for CCD image sensor, that can be seen from comparison of quantum efficiency graphs illustrated in FIGS. 18*a* and 18*b*. For calculation purposes, the charging capacitor Cn capacitance was selected equal to 0.05 pF. The sensitivity gain for several selected wavelengths inside the CCD operating band is exemplified. The selected wavelength of 1,050 nm corresponds to the night glow (the illuminance peak without the moon).

Figure 18A:
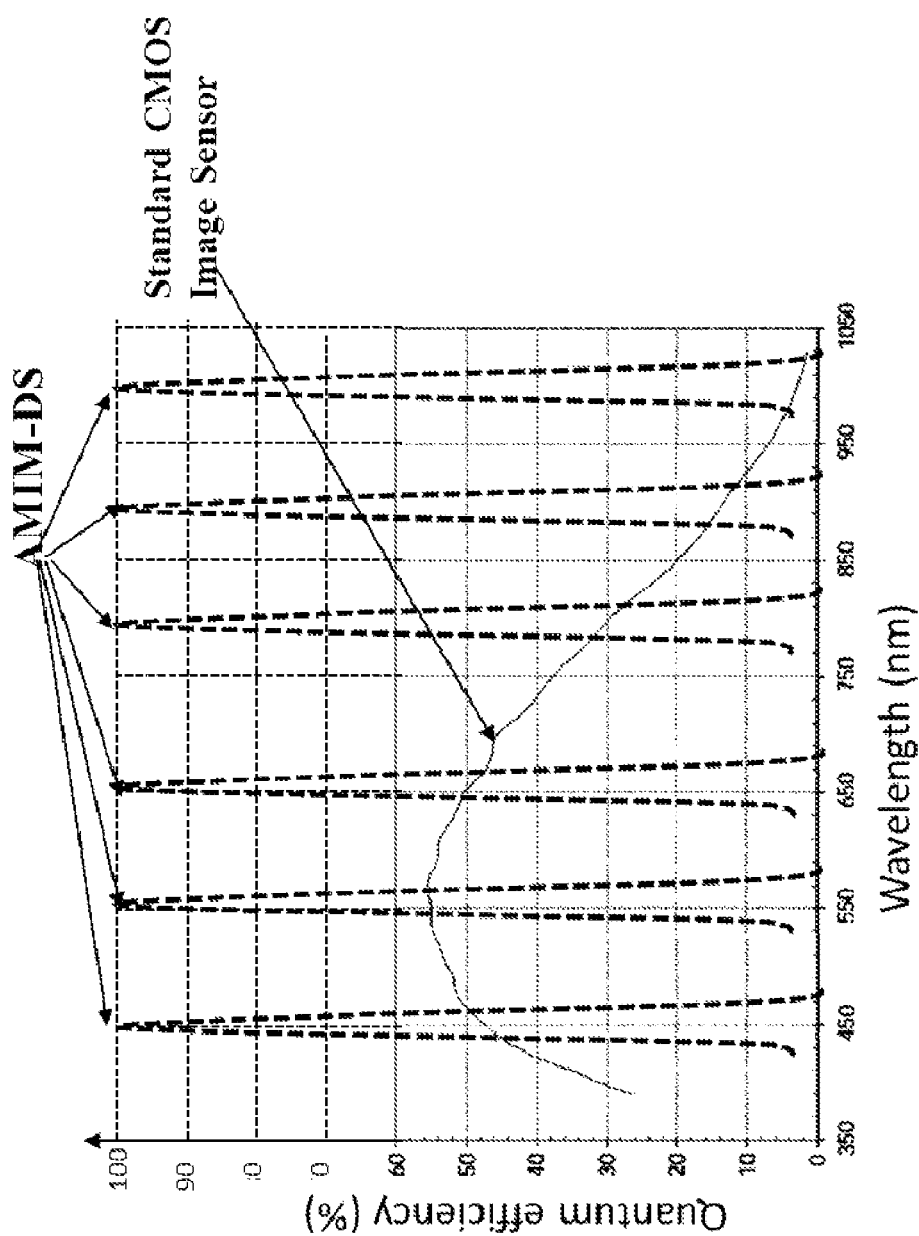
FIG. 18a illustrates the Quantum Efficiency Curve for standard CMOS image sensors.
Figure 18B:
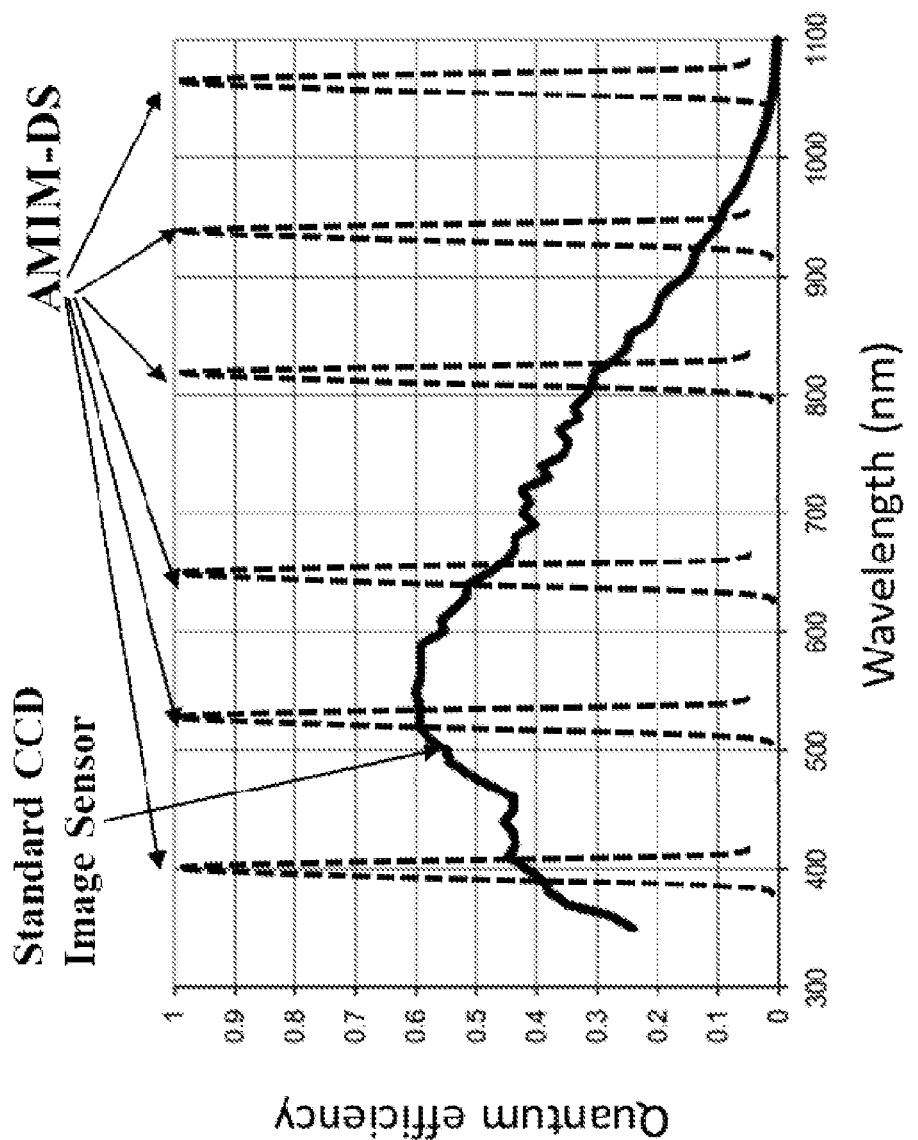
FIG. 18b illustrates the Quantum Efficiency Curve for standard CCD image sensors.

Reference is made to FIGS. 18*a* and 18*b*, which illustrate 100% theoretical limit for AMIM-DS Quantum Efficiency compared with Quantum Efficiency of Standard CMOS and CCD Image Sensors respectively. The comparison relates to CMOS image sensor Model MT9M001, and CCD image sensor Model KAF-16803, made by On Semiconductor.

The data for the CCD sensor:

| | | | | CCD | |
|---|---|---|---|---|---|
| Photon Wavelength [nm] $\lambda$ | Photon Energy [J] W | Node Charging capacitor [pF] Cn | Voltage per 1 electron on the node charging capacitor [$\mu$V/e] Ve | Quantum Efficiency [%] $QE_{CCD}$ | Normalized Voltage per 1 photon on the node charging capacitor [$\mu$V/e] $V_{CCD}$ |
| 350 | 5.68E−19 | 0.05 | 3.2 | 25% | 0.800 |
| 600 | 3.31E−19 | | | 57% | 1.826 |
| 825 | 2.41E−19 | | | 30% | 1.057 |
| 1,050 | 1.81E−19 | | | 2% | 0.064 |

And, under extremely weak or a regular intensity of a visible or IR radiation the data for the rectenna incorporating the AMIM-DS of the invention, together with the sensitivity gain in the last column on the right:

| Photon Wavelength [nm] $\lambda$ | Photon Energy [J] W | Node Charging capacitor [pF] Cn | Rectenna with AMIM-DS | | The Sensitivity Gain Rectenna/CCD $V_R/V_{CCD}$ |
|---|---|---|---|---|---|
| | | | Conversion Efficiency [%] E | Voltage per 1 photon on the node charging capacitor [µV/p] $V_R$ | |
| 350 | 5.68E-19 | 0.05 | 25% | 0.8 | 1 |
| | | | 50% | 1.6 | 0.87 |
| | | | 90% | 2.88 | 3.6 |
| 600 | 3.31E-19 | | 50% | 1.6 | 0.88 |
| | | | 80% | 2.56 | 1.4 |
| | | | 90% | 2.88 | 1.6 |
| 825 | 2.41E-19 | | 50% | 1.6 | 2 |
| | | | 80% | 2.56 | 3.2 |
| | | | 90% | 2.88 | 3.6 |
| 1,050 | 1.81E-19 | | 5% | 0.16 | 1.6 |
| | | | 50% | 1.6 | 17 |
| | | | 80% | 2.56 | 23 |

The obvious difference in the quantum efficiency results in the sensitivity gain of the AMIM-DS rectenna-based pixel over CMOS/CCD pixel and mainly in near IR range.

In opposite to usual photoelectric semiconductor converters where a group of incident photons generate only one electron due to a quantum efficiency that is always less than 1, in optical rectenna the incident photon flow induces on AMIM-DS's nanoantenna a fluctuating electrical energy that is proportional to cumulative energy of the incident photons. This induced electrical energy is described as multiplication of voltage and electrical current in the nanoantenna. A magnitude of the induced voltage on nanoantenna turns on the MIM diode operation in a classical work mode. Without losses, a magnitude of the induced voltage is described by a classical equation $V_A=(W_{ph}*R)^{1/2}$, where $V_A$ is the voltage on the MIM diode anode, $W_{ph}$ is a cumulative power of the incident photon flow and R is an input resistance between MIM diode anode and ground as it is seen from nanoantenna. Rectified electrical current, which flows through MIM diode, charges a node charge capacitor that is an intrinsic component in any digital image sensor. Without losses, the electrical current is described by a classical equation $I_{D1}=(W_{ph}/R)^{1/2}$, where $I_{D1}$ is the current through the MIM diode, $W_{ph}$ is a cumulative power of the incident photon flow and R is an input resistance between MIM diode anode and ground as it is seen from nanoantenna. Accordingly, the voltage on the node charge capacitor is calculated according to the well-known equation:

$$V_C = I_{D1}*t/Cn,$$

where $V_C$ is a voltage on the node charge capacitor, $I_{D1}$ is a current through the MIM diode, t is an exposure time and Cn is the capacitance value of a node charge capacitor.

Figure 19A:
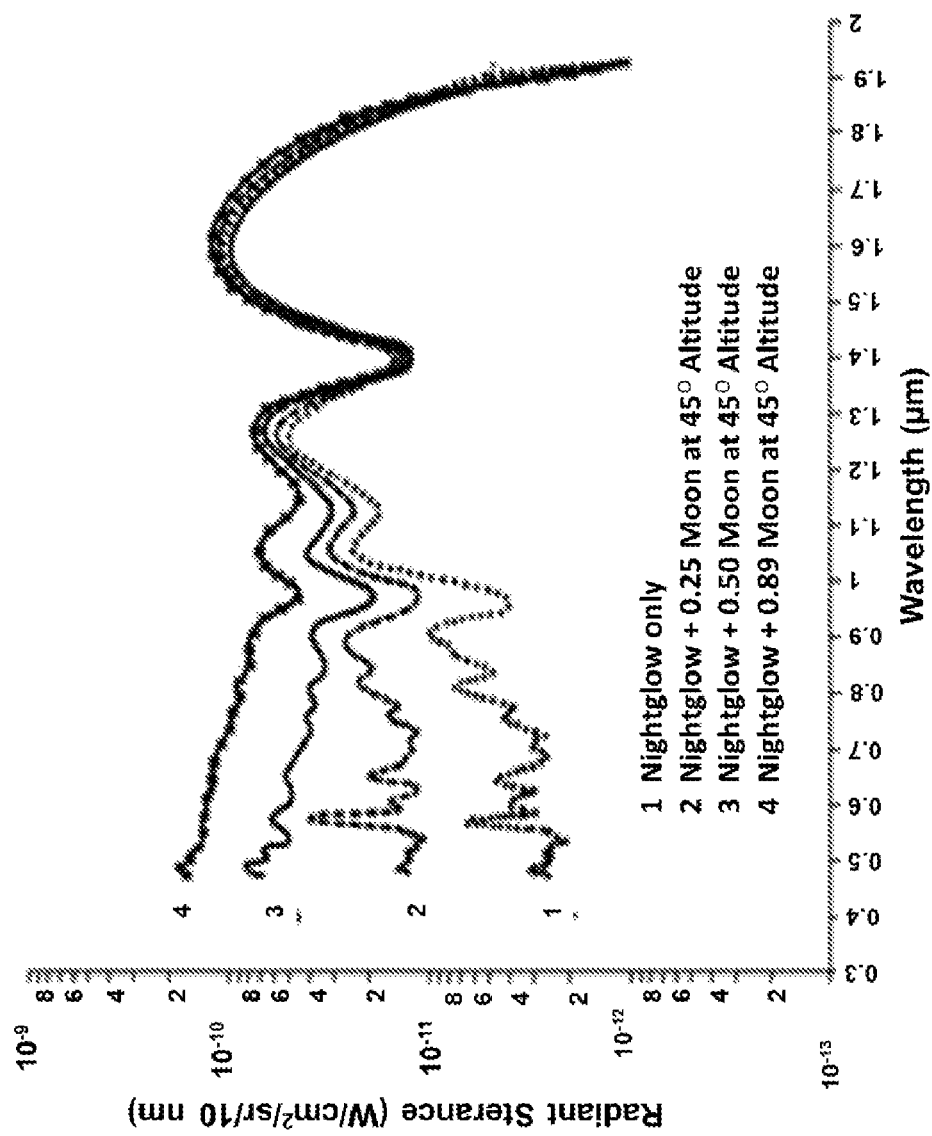
FIG. 19a illustrates a night sky spectral radiant sterance for various phases of the moon as measured by Vatsia, Stich and Dunlap.

Reference is made to FIG. 19a which illustrates a night sky spectral radiant sterance for various phases of the moon as measured by Vatsia, Stich and Dunlap. During a night without moon at infrared wavelength of 1,050 nm the radiant energy density is approximately $2.4*10^{-11}$ W/cm²/sr/10 nm that corresponds approximately to $1.3*10^8$ photons/s/cm²/sr/10 nm. At wavelength of 1,050 nm, CCD image sensors have quantum efficiency in range of 2% that requires a pixel area of several tens micron, tens of seconds exposure time and cooling for capturing an acceptable image. It is known that a single electron produces 3.2 µV on the node charge capacitor of 0.05 pF. For reaching a measurable value of 1 mV, a CCD pixel must generate 312 electrons which correspond to 15,625 photons impacting a CCD pixel with quantum efficiency of 2%. For described night conditions, the exposure time is about 100 ms. In usual CCD image sensor, a saturation signal on the analog-to-digital converter input is about 2.7V, so for using a full signal magnitude the exposure time desirable to enlarge in about 2,700 times.

On an AMIM-DS nanoantenna with effective area of 1 µm² at a night without moon the radiant energy is $2.4*10^{-19}$ W/10 nm. AMIM-DS having a 100 Ohm input resistance R, even with efficiency as small as 1%, will generate through MIM diode a DC electrical current of about 0.25 pA. During exposure time of 10 ms AMIM-DS will produce on the node charge capacitor of 0.05 pF a voltage of about 50 mV. It is obvious that in near infrared range AMIM-DS has much higher speed and higher sensitivity in comparison with CCD or CMOS sensors.

Figure 19B:
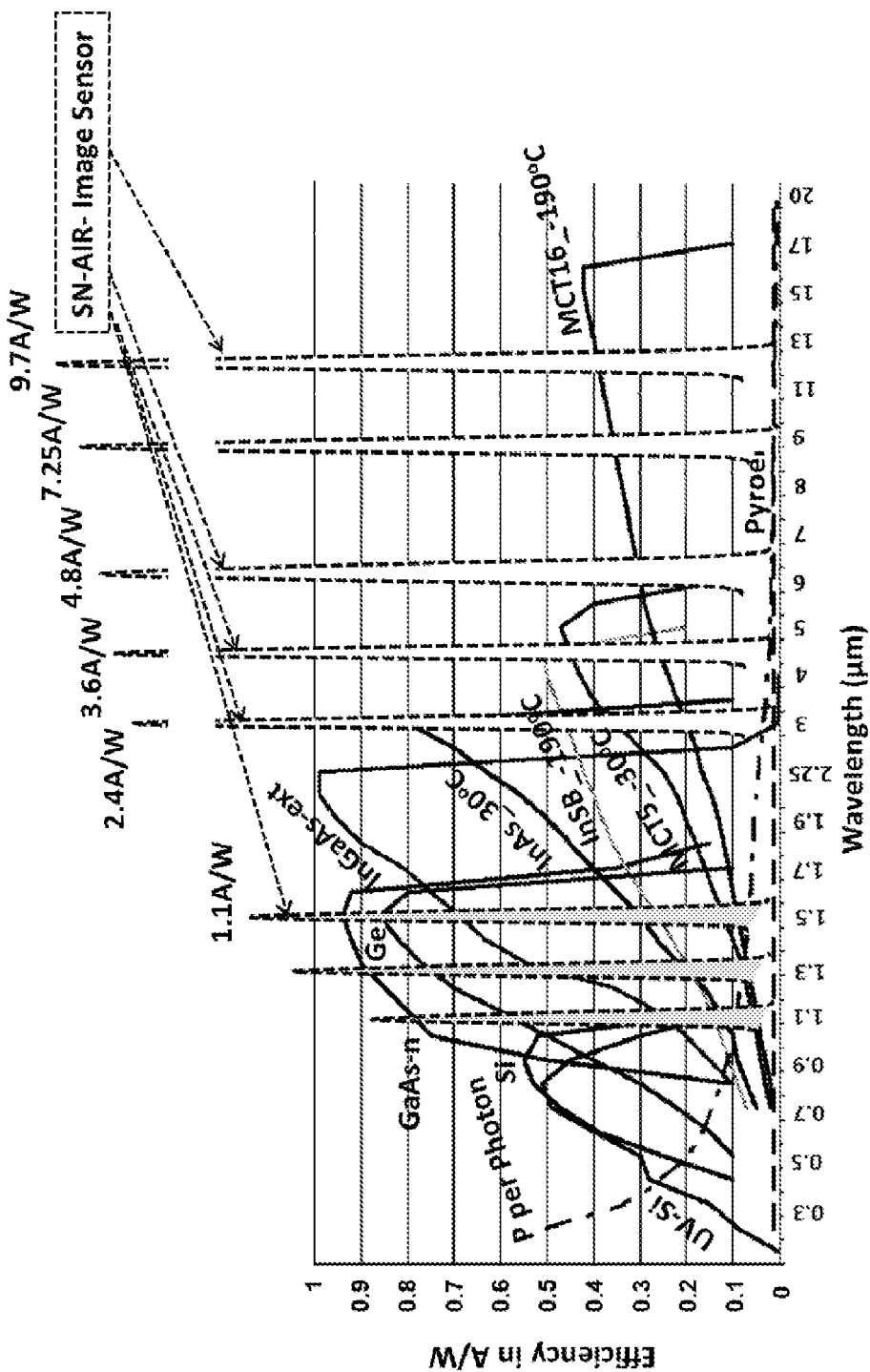
FIG. 19b illustrates a sensitivity comparison from near IR to thermal IR spectrum between AMIM-DS and compound semiconductor materials, which are used for digital image sensors.

Reference is made to FIG. 19b, which illustrates an AMIM-DS theoretical sensitivity limit at 100% conversion efficiency in near and thermal IR spectrum compared with compound semiconductor materials, which are used for digital image sensors in thermal vision cameras. In near IR range 1.1÷1.5 µm the AMIM-DS sensitivity is more on 10-12%. In thermal IR range 4.5÷12.5 µm in comparison with, for example, compound semiconductor material MCT16_−190° C. the AMIM-DS sensitivity ranges from 3.6 A/W to 9.7 A/W that is more in 14÷24 times than MCT16_−190° C. sensitivity. As clearly shown in FIG. 19b, in overall spectrum from near to thermal IR the sensitivity comparison of the AMIM-DS with compound semiconductor materials used for thermal image sensors demonstrates the photon conversion gain increases from 1.2 to 24 times that depends on the wavelength, a semiconductor material and, as well, on the AMIM-DS conversion efficiency E. For example, at IR wavelengths 8.5÷12.8 µm, which correspond to a peak wavelength radiation for temperatures 68÷−46° C., at 5% conversion efficiency the AMIM-DS sensitivity will correspond to MCT16_−190° C. sensitivity that is 0.35÷0.38 A/W.

In contrast to thermal image sensors, which are based on compound semiconductor materials, that are bulky, expensive, energy-intensive and time-consuming for reaching a necessary cryogenic temperature, the AMIM-DS-based image sensor will be portable, cheap, will not need energy for cooling and will perform immediately after power on. A very important AMIM-DS' advantage is a low manufacturing cost, which is estimated in thousands time less than cost of contemporary semiconductor thermal image sensors that enables manufacturing of commercial thermal image sensors with a several Megapixel resolution.

Other non-limiting applications using the AMIM-DS device, include:

Ultra-sensitive nano-scale photo-detector and/or image sensor for quantitative assessment, measurement and spectral analysis in medical inspection procedures;

Ultra-sensitive nano-scale photo-detector and/or image sensor for quantitative assessment, measurement and spectral analysis in biological investigation and diagnosis procedures;

Single-photon nano-scale detector for IR and visible data communication;

Ultra-sensitive nano-scale photo-detector and/or image sensor for nondestructive testing at IR and visible ranges.

The AMIM-DS can be successfully used, as it was mentioned above, for the solar energy harvesting panels instead of the contemporary silicon PV-cells.

It is understood that the invention can be utilized in a wide variety of applications and industries, and the above examples and embodiments are intended mainly for facilitating understanding of the invention and its different aspects, however the invention is by no means limited to the aforementioned examples and embodiments.

The invention claimed is:

1. An electric rectifier for use in a rectenna device, configured to provide direct conversion of solar and heat radiation into electricity, the electric rectifier comprising an integrated structure comprising:
a diode structure comprising first and second electrodes located in first and second conductive layers respectively and an insulating layer between them, the diode structure being configured and operable for receiving an input signal and generating output signal indicative thereof; and
a compensation structure electrically connected in parallel to said diode structure and being configured to compensate an intrinsic parasitic capacitance of the diode structure when a frequency spectrum of the input signal is beyond a cutoff frequency of the diode;
wherein said compensation structure provides a parallel electric resonance with said diode structure at an intended frequency of said frequency spectrum of said input signal; and
wherein said compensation structure comprises an inductor and a capacitor connected in series and both configured to resonate at said intended frequency.

2. The electric rectifier according to claim 1, wherein said diode structure is asymmetric such that said first and second conductive layers have different first and second work functions respectively.

3. The electric rectifier according to claim 2, wherein said first work function is larger than said second work function when electric current flows through the diode from said second electrode to said first electrode.

4. The electric rectifier according to claim 3, wherein said first conductive layer is made from adjacent regions of platinum and aluminum and said second conductive layer is made from aluminum.

5. The electric rectifier according to claim 2, wherein said second work function is larger than said first work function when electric current flows through the diode from said first electrode to said second electrode.

6. The electric rectifier according to claim 5, wherein said second conductive layer is made from adjacent regions of platinum and aluminum and said first conductive layer is made from aluminum.

7. The electric rectifier according to claim 1, wherein said inductor is configured as a bended strip or configured as any shape performing an inductance in predestined frequency spectrum.

8. The electric rectifier according to claim 1, wherein said inductor is made from a material of said first or second conductive layers.

9. The electric rectifier according to claim 1, wherein said inductor is located in said first or second conductive layers.

10. The electric rectifier according to claim 1, wherein said capacitor comprises first and second conductive plates located in said first and second conductive layers respectively and interspaced by an insulator.

11. The electric rectifier according to claim 10, wherein said first and second conductive plates are made from a material of said second conductive layer when electric current flows through the diode from said second electrode to said first electrode.

12. The electric rectifier according to claim 10, wherein said first and second conductive plates are made from a material of said first conductive layer when electric current flows through the diode from said first electrode to said second electrode.

13. The electric rectifier according to claim 10, wherein said insulator of the capacitor is located in said insulating layer.

14. The electric rectifier according to claim 1, wherein each of said first and second conductive layers are made from metal, metamaterial, material having a permittivity with a negative real part in said frequency, or any combination thereof.

15. The electric rectifier according to claim 1, wherein said insulating layer is made from aluminum oxide ($Al_2O_3$).

16. The electric rectifier according to claim 1, further comprising a dielectric layer beneath said first conductive layer.

17. The electric rectifier according to claim 16, wherein said dielectric layer is made from silica.

18. The electric rectifier according to claim 16, further comprising a silicon substrate layer beneath said dielectric layer.

19. The electric rectifier according to claim 1, wherein said frequency of the input signal corresponds to infrared, visible or ultraviolet electromagnetic spectrum.

* * * * *